(12) United States Patent
Zang et al.

(10) Patent No.: US 12,148,845 B2
(45) Date of Patent: Nov. 19, 2024

(54) PHOTODETECTORS, PREPARATION METHODS FOR PHOTODETECTORS, PHOTODETECTOR ARRAYS, AND PHOTODETECTION TERMINALS

(71) Applicant: Shenzhen Adaps Photonics Technology Co. LTD., Shenzhen (CN)

(72) Inventors: Kai Zang, Shenzhen (CN); Shuang Li, Shenzhen (CN); Jieyang Jia, Shenzhen (CN)

(73) Assignee: Shenzhen Adaps Photonics Technology Co. LTD., Shenzhen (CN)

( * ) Notice: Subject to any disclaimer, the term of this patent is extended or adjusted under 35 U.S.C. 154(b) by 536 days.

(21) Appl. No.: 17/318,748

(22) Filed: May 12, 2021

(65) Prior Publication Data
US 2021/0273120 A1  Sep. 2, 2021

Related U.S. Application Data

(63) Continuation of application No. PCT/CN2019/105775, filed on Sep. 12, 2019.

(30) Foreign Application Priority Data

Nov. 12, 2018 (CN) .......................... 201811339767.1

(51) Int. Cl.
*H01L 31/02* (2006.01)
*H01L 31/0216* (2014.01)
(Continued)

(52) U.S. Cl.
CPC .... *H01L 31/02027* (2013.01); *H01L 31/0216* (2013.01); *H01L 31/0352* (2013.01); *H01L 31/107* (2013.01)

(58) Field of Classification Search
CPC ........... H01L 31/02027; H01L 31/0216; H01L 31/0352; H01L 31/107; H01L 27/1446;
(Continued)

(56) References Cited

U.S. PATENT DOCUMENTS 6,377,183 B1  4/2002  Baker et al.
7,977,637 B1  7/2011  Yap et al.
(Continued)

FOREIGN PATENT DOCUMENTS

CN  101183691 A  5/2008
CN  103367476 A  10/2013
(Continued)

OTHER PUBLICATIONS

International Search Report for International Application No. PCT/CN2019/105775 mailed on Dec. 12, 2019.
(Continued)

*Primary Examiner* — Shahed Ahmed

(57) ABSTRACT

A photodetector, a preparation method for a photodetector, a photodetector array and a photodetection terminal. The photodetector comprises a substrate (11) and an optical resonant cavity (10) formed on the substrate (11). The optical resonant cavity (10) may comprise: a light absorption layer (13) having a light-entrance outer surface and a bottom outer surface which are opposite to each other, and an outer sidewall located between the light-entrance surface and the bottom surface; a light-strap structural layer (14) covering the light-entrance surface; and a light-reflection structural layer (12) covering the bottom outer surface and/or the outer sidewall of the light absorption layer (13), wherein the light-reflection structural layer (12) is configured to reflect external light entering the optical resonant cavity (10) by means of the light-trap structural layer (14) to increase a light propagation distance of the external light in the light
(Continued)

absorption layer (13), thereby effectively improving the photon absorption efficiency of the photodetector.

12 Claims, 14 Drawing Sheets

(51) Int. Cl.
H01L 31/0352 (2006.01)
H01L 31/107 (2006.01)

(58) Field of Classification Search
CPC ........... H01L 31/1075; H01L 31/02327; H01L 31/09; H01L 31/1013; H01L 31/145–153; H01L 31/165–173; H01L 27/14625–14629; H01L 51/447; G01S 7/4816
See application file for complete search history.

(56) References Cited

U.S. PATENT DOCUMENTS

| | | | |
|---|---|---|---|
| 2012/0073641 A1 | 3/2012 | Tseng et al. | |
| 2013/0145330 A1 | 6/2013 | Choi | |
| 2015/0340391 A1* | 11/2015 | Webster | H01L 27/1464 257/432 |
| 2015/0356351 A1 | 12/2015 | Saylor et al. | |
| 2015/0372040 A1 | 12/2015 | Pralle et al. | |
| 2018/0090536 A1 | 3/2018 | Mandai et al. | |
| 2019/0165200 A1* | 5/2019 | Masini | H01L 31/107 |
| 2020/0168757 A1* | 5/2020 | Lin | G01J 3/0256 |

FOREIGN PATENT DOCUMENTS

| | | |
|---|---|---|
| CN | 204332979 U | 5/2015 |
| CN | 105280551 A | 1/2016 |
| CN | 106057957 A | 10/2016 |
| CN | 107039556 A | 8/2017 |
| CN | 108573989 A | 9/2018 |
| CN | 109659374 A | 4/2019 |
| CN | 209045574 U | 6/2019 |

OTHER PUBLICATIONS

Jian Ma et al., "Simulation of a high-efficiency and low-jitter nanostructured silicon single-photon avalanche diode", OPTICA, vol. 2, No. 11, Nov. 18, 2015, p. 974, DOI:10.1364/OPTICA.2.000974.
Ghioni M et al., "Resonant-Cavity-Enhanced Single-Photon Avalanche Diodes on Reflecting Silicon Substrates", IEEE Photonics Technology Letters, IEEE, USA, vol. 20, No. 6, Mar. 15, 2008, pp. 413-415, ISSN: 1041-1135.
Zang Kai et al., "Enhanced silicon single-photon avalanche diode based on light trapping", 2018 Conference on Lasers and 1-9 Electro-Optics (Cleo), OSA, May 13, 2018, pp. 1-2.
Zang Kai et al., "Silicon single-photon avalanche diodes with nano-structured light trapping", Nature Communications, vol. 8, No. 1, Sep. 20, 2017, pp. 1-6, DOI: 10.1038/s41467-017-00733-y 1-9 Technical Fields Searched (Ipc) Retrieved from the Internet:URL:http://www.nature.com/articles/s41467-017-00733-y>.
Supplementary Partial European Search Report dated Feb. 17, 2022 for application No. EP19883758.5.
First Notice of Review Observations dated Nov. 21, 2023 for Chinese Application No. 20181339767.1.
Extended European Search Report dated Dec. 4, 2023 for European Application No. 23190530.8.
Defense Industry Press "Fundamentals of photovoltaic technology" Oct. 31, 2011, p. 108.
The Second Office Action dated Apr. 26, 2024 for Chinese Application No. 201811339767.1.
Jihu Peng "Optical Fiber Technology and Application" Jun. 30, 1995, p. 146.
Geping He "Semiconductor Materials" Oct. 31, 2018, pp. 71-72.
Xiaolai Zhou "College Physics" May 31, 1995, pp. 482-483.

* cited by examiner

PHOTODETECTORS, PREPARATION METHODS FOR PHOTODETECTORS, PHOTODETECTOR ARRAYS, AND PHOTODETECTION TERMINALS

CROSS-REFERENCES TO RELATED APPLICATIONS

The present application is a continuation application to International Patent Application No. PCT/CN2019/105775, entitled "PHOTODETECTOR, PREPARATION METHOD FOR PHOTODETECTOR, PHOTODETECTOR ARRAY, AND PHOTODETECTION TERMINAL", filed on Sep. 12, 2019, which claims priority to Chinese Patent Application No. CN201811339767.1, filed on Nov. 12, 2018, and both applications are commonly owned and incorporated by reference herein for all purposes.

BACKGROUND

With the advancement of science and technology and the development of society, the application fields of photoelectric detectors have become more and more extensive, and the corresponding requirements for photoelectric detectors have become higher. Especially for high-precision industries such as deep detection (for example, lidar), medical induction, and quantum communication, requirements on photoelectric detectors based on single-photon detection have become more stringent.

SUMMARY

In view of the above technical problems, it is necessary to provide a photoelectric detector, a method for making a photoelectric detector, a photoelectric detector array, and a photoelectric detection terminal to effectively improve the light absorption efficiency, thereby improving the performance of the photoelectric detector device.

In an alternative embodiment, the present disclosure provides a photoelectric detector, which includes a substrate and an optical resonant cavity formed on the substrate. The optical resonant cavity includes:
  a light absorption layer, having a light ray incident outer surface and a bottom outer surface opposite to each other, and an outer sidewall located between the light ray incident surface and the bottom surface;
  a light-trapping structure layer covering the light ray incident surface; and
  a light reflection structure layer covering the bottom outer surface and/or the outer sidewall of the light absorption layer.

The light reflection structure layer is configured to reflect external light rays traveling through the light-trapping structure layer and entering the optical resonant cavity, to increase optical paths of the external light rays traveling in the light absorption layer, thereby effectively improving the photon absorption efficiency of the photoelectric detector.

In an alternative embodiment, the substrate is a substrate with a light reflection function, to further improve the light reflection ability at a bottom of the optical resonant cavity.

In an alternative embodiment, the substrate is a metal substrate, a substrate with a distributed Bragg reflection mirror structure, a substrate with an SOI structure, or a substrate with an HCG (High Contrast Grating) structure. The SOI can be used to represent silicon on insulator or semiconductor on insulator. In some embodiments of the present disclosure, SOI is used to represent silicon on insulator as an example for illustration, but on the premise of non-conflict, those skilled in the art should be able to understand that the substrate structure of silicon on insulator can be replaced with a substrate structure of semiconductor on insulator.

In an alternative embodiment, when the substrate is an SOI structure substrate, the substrate includes at least two stacked SOI composite layers.

In an alternative embodiment, the light-trapping structure layer has concave-convex structures configured to change the traveling directions of the external light rays traveling through the light-trapping structure layer and entering the optical resonant cavity.

In an alternative embodiment, the concave-convex structures are nano-scale structures.

The concave-convex structures are distributed in an array on a surface of the light-trapping structure layer.

In an alternative embodiment, the concave-convex structures have a longitudinal section in a zigzag shape or a square wave shape.

In an alternative embodiment, when the longitudinal section of the concave-convex structures is in the zigzag shape, the concave-convex structure is a quadrangular pyramid.

In an alternative embodiment, the concave-convex structure includes a protrusion and a groove.

When the longitudinal section of the concave-convex structures is in the square wave shape, the protrusion and/or the groove has a cross-section view in a shape of at least one of a regular polygon and a circle.

In an alternative embodiment, the concave-convex structures are distributed in a square close-packed or hexagonal close-packed pattern on the surface of the light-trapping structure layer.

In an alternative embodiment, when the light reflection structure layer covers the bottom outer surface of the light absorption layer, the light reflection structure layer includes:
  a bottom reflection layer covering the bottom outer surface of the light absorption layer, and configured to reflect light rays entering the bottom outer surface, such that the bottom reflection layer and the light-trapping structure layer form a first optical resonant structure.

In an alternative embodiment, the bottom reflection layer is made of a metal material or a dielectric material.

In an alternative embodiment, when the bottom reflection layer is made of the dielectric material, the dielectric material may be silicon oxide, silicon nitride, and/or other materials.

In an alternative embodiment, when the light reflection structure layer covers the outer sidewall of the light absorption layer, the light reflection structure layer includes:
  a sidewall reflection wall arranged on the substrate so that the sidewall reflection wall surrounds the light absorption layer, the sidewall reflection wall being configured to form a second optical resonant structure.

The second optical resonant structure is configured to perform back and forth reflections on light rays of which directions are changed via the light-trapping structure layer and which enter the sidewall reflection wall.

In an alternative embodiment, the sidewall reflection wall is a light reflection isolation structure formed by filling a deep trench (i.e., deep trench isolation, referred to as DTI).

In an alternative embodiment, the sidewall reflection wall includes:
  an insulating layer covering a bottom and a sidewall of the deep trench; and
  a reflection layer filled in the deep trench.

The deep trench extends to an upper surface or an interior of the substrate.

In an alternative embodiment, the insulating layer is made of a material including silicon oxide.

The reflection layer is made of a material including at least one of silicon oxide, amorphous silicon, polysilicon, or metal.

In an alternative embodiment, the above photoelectric detector may further include:

a circuit layer disposed on the substrate so that the circuit layer is adjacent to the light-trapping structure layer, the circuit layer being configured to convert an optical signal absorbed by the light absorption layer into an electrical signal; and a microlens configured to converge received external light rays to the light incident outer surface of the light-trapping structure layer.

In an alternative embodiment, the photoelectric detector is a single photon detector (i.e., single photon avalanche diode, referred to as SPAD), an avalanche diode (i.e., avalanche photoelectric diode, referred to as APD), or a silicon photomultiplier (referred to as SiPM).

In an alternative embodiment, the present disclosure further provides another photoelectric detector, which may include a substrate, a bottom reflection layer, a light absorption layer, a light-trapping structure layer, and a sidewall reflection wall.

The bottom reflection layer, the light absorption layer, and the light-trapping structure layer are sequentially arranged on the substrate along a direction away from the substrate.

The sidewall reflection wall extends through the light absorption layer and to the bottom reflection layer or to the substrate along a thickness direction of the light absorption layer.

The sidewall reflection wall, the light-trapping structure, and the bottom reflection layer form a sealed optical resonant cavity surrounding the light absorption layer, and the sealed optical resonant cavity is configured to perform reflections on external light rays entering the light absorption layer via the light-trapping structure, thereby further increasing the optical paths of the external light rays in the light absorption layer, so as to effectively improve the light absorption efficiency of the photoelectric detector.

In an alternative embodiment, the light-trapping structure layer has nano-scale concave-convex structures.

The concave-convex structures are distributed in an array on a surface of the light-trapping structure layer.

In an alternative embodiment, the concave-convex structures have a longitudinal section in a zigzag shape or a square wave shape.

In an alternative embodiment, the concave-convex structure includes a protrusion and a groove.

When the longitudinal section of the concave-convex structures is in a square wave shape, the protrusion and/or the groove has a cross-section view in a shape of at least one of a regular polygon and a circle.

In an alternative embodiment, the concave-convex structures are distributed in a square close-packed or hexagonal close-packed pattern on the surface of the light-trapping structure layer.

In an alternative embodiment, the bottom reflection layer is made of metal or silicon oxide.

In an alternative embodiment, the sidewall reflection wall is a light reflection isolation structure formed by filling a deep trench.

In an alternative embodiment, the sidewall reflection wall includes:

an insulating layer covering an inner surface of the deep trench; and a reflection layer filled in the deep trench covered with the insulating layer on the inner surface thereof.

The deep trench extends to an upper surface or an interior of the substrate.

In an alternative embodiment, the insulating layer is made of a material including silicon oxide.

The reflection layer is made of a material including at least one of silicon oxide, amorphous silicon, polysilicon, or metal.

In an alternative embodiment, the above photoelectric detector may further include:

a circuit layer disposed on the substrate so that the circuit layer is adjacent to the light-trapping structure layer, the circuit layer being configured to convert an optical signal absorbed by the light absorption layer into an electrical signal; and a microlens configured to converge received external light rays to the light incident surface of the light-trapping structure layer.

In an alternative embodiment, the photoelectric detector is a single-photon detector, an avalanche diode, or a silicon photomultiplier.

In an alternative embodiment, the present disclosure further provides a photoelectric detector, which includes:

a substrate;

a bottom reflection layer covering an upper surface of the substrate;

a light absorption layer formed on an upper surface of the bottom reflection layer;

a sidewall reflection wall extending through the light absorption layer and to the bottom reflection layer along a thickness direction; and a light-trapping structure layer disposed on an upper surface of the light absorption layer.

A first doped region, a second doped region, a third doped region, a fourth doped region, and a fifth doped region are formed in the light absorption layer. Doping ions in the first doped region, the second doped region, and the third doped region are first-type ions, and doping ions in the fourth doped region and the fifth doped region are second-type ions. An ion concentration of the third doped region is greater than an ion concentration of the second doped region, an ion concentration of the fifth doped region is greater than an ion concentration of the fourth doped region, and an ion concentration of the first doped region is gradually reduced along a direction away from the bottom reflection layer.

The second doped region, the third doped region, the fourth doped region, and the fifth doped region are formed in the first doped region. The third doped region is formed on an interface between the sidewall reflection wall and the light absorption layer. A gap is left both between the third doped region and the second doped region and between the third doped region and the fourth doped region. The fourth doped region is formed at a position of the upper surface of the light absorption layer. The fifth doped region is formed at a position of an upper surface of the light absorption layer in the fourth doped region, and the light-trapping structure is disposed in the fifth doped region. A bottom surface of the light-trapping structure is in contact with the fourth doped region.

In an alternative embodiment, the above photoelectric detector may further include:

an insulating composite layer disposed on the upper surface of the light absorption layer so that the insulating composite layer is adjacent to the sidewall reflection wall;

a quenching resistor layer formed in the insulating composite layer; and a first electrode and a second electrode formed above the insulating composite layer.

The first electrode is electrically connected to the third doped region, and the second electrode is electrically connected to the quenching resistor and the fifth doped region, respectively.

In an alternative embodiment, the light-trapping structure layer includes a nanostructure film formed by etching the light absorption layer based on a shallow trench process.

In an alternative embodiment, the nanostructure layer has a plurality of trenches, and the light-trapping structure layer further includes:

a filling film configured to fill the plurality of trenches, such that the light-trapping structure layer has a flat surface.

In an alternative embodiment, a sixth doped region is formed at a position of an upper surface of the nanostructure film.

Doping ions in the sixth doped region are the first-type ions.

In an alternative embodiment, the ion concentration of the second doped region is greater than the ion concentration of the first doped region, an ion concentration of the sixth doped region is greater than the ion concentration of the second doped region, and the ion concentration of the third doped region is greater than the ion concentration of the sixth doped region.

The third doped region, the fourth doped region, and the sixth doped region are each a heavily doped region.

In an alternative embodiment, the first-type ions are P-type ions, and the second-type ions are N-type ions.

In an alternative embodiment, the present disclosure further provides a photoelectric detector array, which includes a plurality of photosensing units distributed in an array.

The photosensing unit includes the photoelectric detector according to any one of the above embodiments.

When the photoelectric detector includes a light reflection structure layer, the light reflection structure layer covers a sidewall of the optical resonant cavity, so as to improve the light absorption efficiency of the photoelectric detector array, and optically isolating the adjacent photosensing units by using the light reflection structure layer or the sidewall reflection wall or other elements, thereby effectively avoiding the defect of optical crosstalk.

In an alternative embodiment, the present disclosure further provides a method for making a photoelectric detector, which includes:

providing a substrate, and forming a silicon epitaxial layer on the substrate, a gradually doped region being formed in the silicon epitaxial layer, and the gradually doped region including a plurality of device unit regions;

manufacturing a sidewall isolation wall on an interface between the device unit regions, so as to photoelectrically isolate adjacent device unit regions;

manufacturing a plurality of sub-doped regions in the device unit regions, and then manufacturing a light-trapping structure on top of the silicon epitaxial layer; and manufacturing a quenching resistor and each electrode structure on a surface of the top of the silicon epitaxial layer.

In an alternative embodiment, during the growth of the silicon epitaxial layer, the doping process may be performed while performing the epitaxial growth, so as to form a gradually doped region in the silicon epitaxial layer while manufacturing and forming the silicon epitaxial layer. In addition, the doping process may also be performed after the silicon epitaxial layer has been formed by performing the epitaxial growth, so as to form the above gradually doped region in the manufactured silicon epitaxial layer.

In an alternative embodiment, the substrate is a metal substrate, a substrate with a distributed Bragg reflection mirror structure, or a substrate with an SOI structure.

In an alternative embodiment, the method further includes:

manufacturing a bottom reflection layer on the substrate, and then forming the silicon epitaxial layer above the bottom reflection layer.

In an alternative embodiment, the step of manufacturing a light-trapping structure on a top of the silicon epitaxial layer includes:

etching the top of the silicon epitaxial layer with a shallow trench etching process to form a plurality of nano-scale optical structures.

In an alternative embodiment, the method further includes:

Performing, after manufacturing the quenching resistor and each electrode structure on the surface of the top of the silicon epitaxial layer, surface passivation and/or electrical insulation treatment on the plurality of nano-scale optical structures.

In an alternative embodiment, an ion concentration of the gradually doped region is gradually reduced along a direction away from the substrate.

In an alternative embodiment, the sidewall isolation wall is manufactured based on a trench etching and filling process.

In an alternative embodiment, the step of manufacturing the sidewall isolation wall based on a trench etching and filling process includes:

forming a deep trench on an interface between the unit device regions by using a deep trench etching process;

depositing an insulating layer covering a bottom and a sidewall of the deep trench; and manufacturing a reflection layer fully filling the deep trench.

The deep trench extends to an upper surface or an interior of the substrate.

In an alternative embodiment, the insulating layer is made of a material including silicon oxide.

The reflection layer is made of a material including at least one of silicon oxide, amorphous silicon, polysilicon, or metal.

In an alternative embodiment, the present disclosure further provides a photonic chip, which may include the photoelectric detector described in any of the above embodiments.

In an alternative embodiment, the present disclosure further provides a photoelectric detection terminal, which includes:

a device body; and the photoelectric detector array as described above, which is connected to the device body.

The device body performs photoelectric sensing on photons through the photoelectric detector array.

In an alternative embodiment, the photoelectric detection terminal includes a lidar device, a mobile communication device, and an image processing device.

There are other embodiments as well. One general aspect of certain embodiments provides a photodetector device comprising an absorption material having a top side and a bottom side, a first deep trench structure, a second deep trench structure, an active region on the top side of the absorption material, a light-trapping region, a substrate configured near the bottom side, and a bottom reflection layer positioned between the substrate and the absorption material. The first deep trench structure is configured adjacent to a first lateral side of the absorption material and comprises a first inner wall and a first outer wall. The first outer wall comprises a first light absorption surface. The second deep trench structure is configured adjacent to a second lateral side of the absorption material. The light-trapping region overlays the active region and comprises a first structure and a second structure separated by a predetermined spacing. The predetermined spacing is less than two microns and associated with a target wavelength and an absorption angle. The first inner wall of the first deep trench structure comprises a metal material (e.g., Tungsten material) and the first outer wall of the first deep trench structure comprises an oxide material or a combination of different oxide materials. The first structure and the second structure of the light-trapping region are characterized by a substantially rectangular or triangular shape.

In various embodiments, the target wavelength of the photodetector device is associated with a wavelength between 900 nm and 950 nm. The substrate comprises an SOI structure. The first deep trench structure also comprises a reflection layer and an isolation layer. The photodetector device also includes a passivation layer overlaying the active region and a microlens overlaying the light-trapping region.

According to some embodiments, the first light absorption surface is characterized by a surface roughness associated with etching, deposition, or growth process. The absorption material is characterized by a concentration gradient. The active region further comprises a p-n junction region configured within the absorption material.

Another general aspect of certain embodiments provides a lidar apparatus comprising an array of photodetectors including a first photodetector and a second photodetector. A first isolation structure is configured between the first photodetector and the second photodetector and comprises a first sidewall with a first light absorption surface. A second isolation structure comprises a second sidewall with a second light absorption surface. The first photodetector comprises an absorption region configured between the first sidewall and the second sidewall, a light-trapping region overlaying the absorption region, and a reflective layer underlaying the absorption region. The light-trapping region includes patterned structures associating with a spacing of less than two microns. The lidar apparatus also includes a SPAD region positioned within the absorption region and an optical resonant cavity positioned between the first light absorption surface and the second light absorption surface. A composite layer partially overlays the light-trapping region. The lidar apparatus also comprises an implant region interfacing the first light absorption surface. The implant region is characterized by a tapered profile and a reduced impedance. An electrode is coupled to the implant region.

Yet another general aspect of certain embodiments includes a photodetector device comprising a first deep trench structure, a second deep trench structure, an absorption region, an active region overlaying the absorption material, a light-trapping region, and a bottom reflection layer. The first deep trench structure comprises a first inner wall and the first outer wall, the first outer wall comprising a first light absorption surface. The absorption region is configured between the first deep trench and the second deep trench and comprises a gradual ion concentration profile. The light-trapping region overlays the active region and comprises a first structure and a second structure separated by a predetermined spacing. The predetermined spacing is less than two microns. The photodetector device also includes an electrode coupled to a sensing circuit.

The present invention achieves these benefits and others in the context of known technology. However, a further understanding of the nature and advantages of the present invention may be realized by reference to the latter portions of the specification and attached drawings.

BRIEF DESCRIPTION OF THE DRAWINGS

FIG. 2b is a schematic diagram showing incident light rays scattered by a light-trapping structure shown in FIG. 2a.

FIG. 4b is a schematic diagram showing incident light rays reflected and isolated by a light reflection structure shown in FIG. 4a.

FIG. 4c is a schematic diagram showing a configuration of an SOI substrate shown in FIG. 4a.

DETAILED DESCRIPTION

In various embodiments, the present invention provides photodetectors configured with light-trapping structures that provide improved light absorption efficiency compared to conventional devices and methods thereof. The light absorption efficiency of a conventional photoelectric detector is low and inadequate for product performance.

In order to make the purposes, technical solutions, and advantages of the present disclosure more apparent and understandable, the present disclosure is further described in detail below with reference to the accompanying drawings and embodiments. It should be understood that the specific embodiments illustrated herein are merely for the purpose of explanation, and should not be deemed to limit the present disclosure.

In view of the technical problem that the photon absorption efficiency of the conventional photoelectric detector is relatively low, embodiments of the present disclosure creatively propose a novel photoelectric detector. By arranging a light-trapping structure layer on a light absorption layer, meanwhile manufacturing a light reflection structure layer on a bottom surface and/or sidewall of the light absorption layer, an optical resonant cavity with excellent light reflection performance is formed of the light-trapping structure layer and the light reflection structure layer, thereby effectively increasing optical paths of the external light rays traveling in the light absorption layer, and further effectively improving the photon absorption efficiency.

Figure 1:
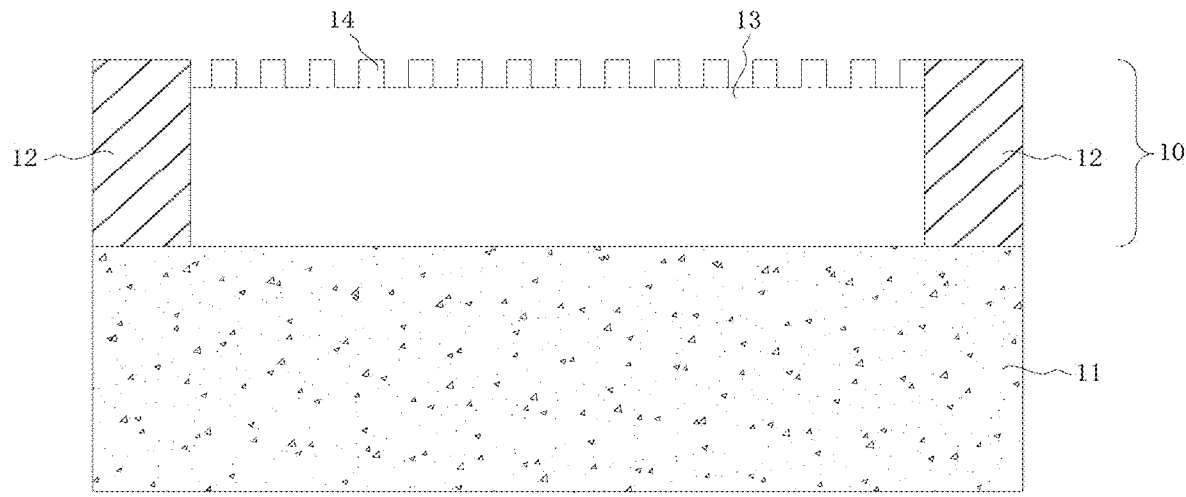
FIG. 1 is a cross-sectional diagram schematically showing a configuration of a photoelectric detector in an alternative embodiment.

FIG. 1 is a cross-sectional diagram schematically showing a configuration of a photoelectric detector in an embodiment. As shown in FIG. 1, a photoelectric detector may include a substrate 11 and an optical resonant cavity 10 disposed on the substrate 11, and the like, and the optical resonant cavity may include a light reflection structure layer 12, a light absorption layer 13 (may also be referred to as "absorption material"), and a light-trapping structure layer/region 14, and other components. The light absorption layer 13 may have a light ray incident outer surface (an upper surface as shown in FIG. 1) and a bottom outer surface (a lower surface as shown in FIG. 1) opposite to each other, and an outer sidewall (a peripheral sidewall as shown in FIG. 1) located between the light ray incident surface and the bottom surface. The light-trapping structure layer/region 14 covers the light ray incident surface (that is, the upper surface as shown in FIG. 1) of the above light absorption layer 13, so as to be configured to reflect, refract, and scatter received external light rays, and further to disperse the incident external light rays into multiple angles in the light absorption layer 13, thereby increasing optical paths of the external light rays in the light absorption layer 13 and enhancing photon absorption efficiency. Meanwhile, the light reflection structure layer 12 may cover the sidewall of the light absorption layer 13, to surround the light absorption layer 13 to form a first optical resonant cavity in an extending direction of the light absorption layer 13 so as to perform back and forth reflections on the external light rays which travel through the light-trapping structure layer/region 14 and of which traveling directions are changed by the light-trapping structure layer/region 14. That is, the first optical resonant cavity can perform back and forth reflections on the light rays along the extending direction of the light absorption layer 13 as shown in FIG. 1, so as to further increase the optical paths of the external light rays traveling in the absorption layer 13. Materials of the above light-trapping structure layer/region 14 and the light absorption layer 13 may be the same or different. For example, the above light-trapping structure layer/region 14 and the light absorption layer 13 can be manufactured based on one same structure film layer, or the above light-trapping structure layer/region 14 may be manufactured separately on the light absorption layer 13 by using other processes or materials.

In an embodiment, as shown in FIG. 1, substrate 11 may be a substrate with an optical signal reflection function, such as a metal substrate, a substrate with a distributed Bragg reflection (DBR) mirror, or a substrate with an SOI (silicon-on-insulator) structure, and the like, such that the substrate 11 and the above trapping structure layer 14 form a third resonant cavity in a thickness direction of the light absorption layer 13 while the substrate 11 reflects the incident light rays to increase the optical paths, to further increase the optical paths of the external light rays in the light absorption layer 13. To further improve the optical signal reflection function of the substrate 11, at least two (for example, two or three, or more) stacked SOI composite layers can further be disposed in substrate 11.

Figure 2A:
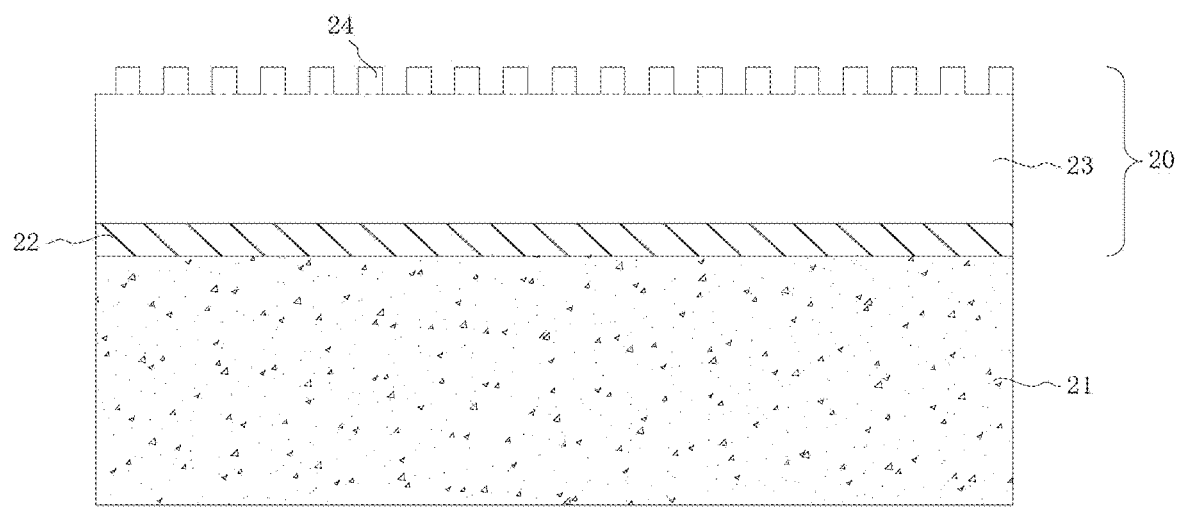
FIG. 2a is a cross-sectional diagram schematically showing a configuration of a photoelectric detector in another alternative embodiment.
Figure 2B:
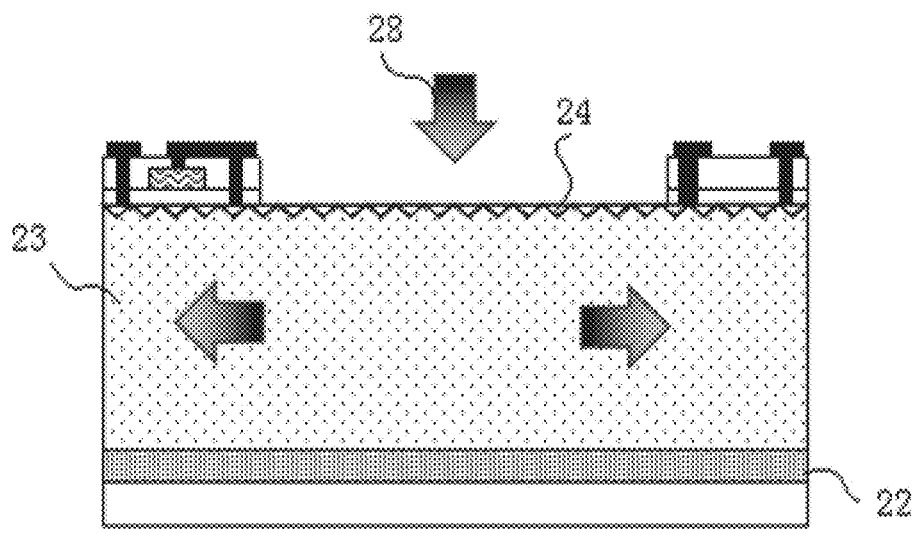

FIG. 2a is a cross-sectional diagram schematically showing a configuration of a photoelectric detector in another alternative embodiment, and FIG. 2b is a schematic diagram showing incident light rays scattered by a light-trapping structure shown in FIG. 2a. As shown in FIGS. 2a-2b, in another alternative embodiment, a photoelectric detector may include a substrate 21 and an optical resonant cavity 20 disposed on the substrate 21, and the like, and the optical resonant cavity may include a light reflection structure layer 22, a light absorption layer 23 (may also be referred to as "absorption material"), a light-trapping structure layer/region 24, and other components. The light absorption layer 23 may have a light ray incident outer surface (an upper surface as shown in FIG. 2) and a bottom outer surface (a lower surface as shown in FIG. 2) opposite to each other, and an outer sidewall (a peripheral sidewall as shown in FIG. 2) located between the light ray incident surface and the bottom surface. The light-trapping structure layer/region 24 may cover the light ray incident surface (that is, the upper surface as shown in FIG. 2) of the above light absorption layer 23, to be configured to reflect, refract, and scatter received external light rays 28, and further to disperse the incident external light rays into multiple angles in the light absorption layer 23 (the incident light rays traveling along an extending direction of the light absorption layer 23 as shown in FIG. 26), thereby increasing optical paths of the external light rays in the light absorption layer 23. Meanwhile, the light reflection structure layer 22 may cover the bottom outer surface of the light absorption layer 23, so that the light reflection structure layer 22 and the above light-trapping structure layer/region 24 form a second optical resonant cavity in a thickness direction of the light absorption layer 23 so as to perform back and forth reflections on the external light rays which travel through the light-trapping structure layer/region 24 and of which traveling directions are changed by the light-trapping structure layer/region 24. That is, the second optical resonant cavity can perform back and forth reflections on the light rays along the thickness direction of the light absorption layer 23 as shown in FIG. 2, so as to further increase the optical paths of the external light rays traveling in the absorption layer 23.

Figure 3:
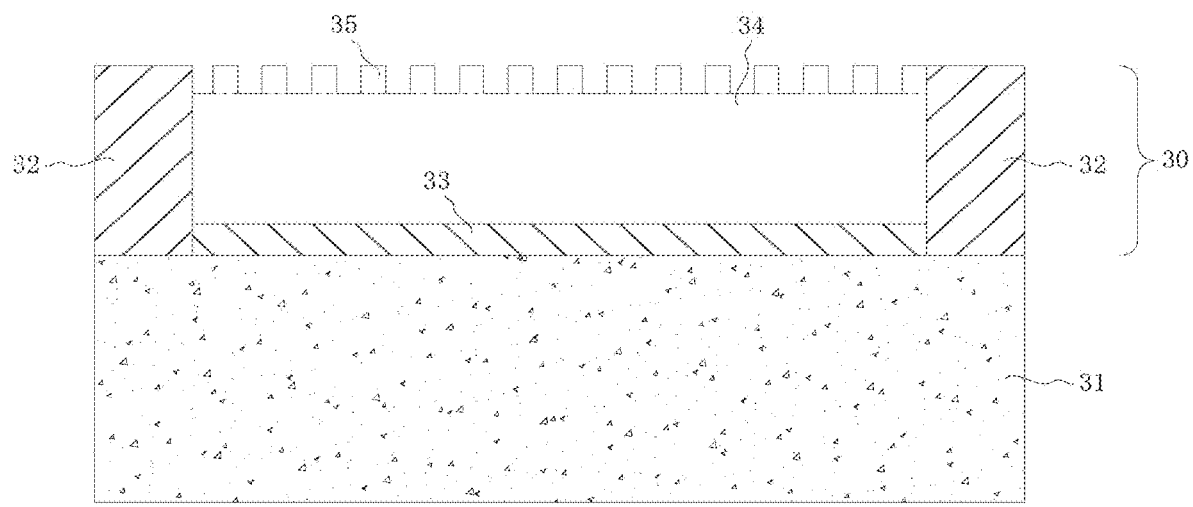
FIG. 3 is a schematic diagram showing a configuration of a photoelectric detector with a sealed optical resonant cavity in an alternative embodiment.

FIG. 3 is a schematic diagram showing a configuration of a photoelectric detector with a sealed optical resonant cavity in an alternative embodiment. As shown in FIG. 3, based on the configuration of the photoelectric detector shown in FIGS. 1 and 2a-2b, another photoelectric detector is provided in this embodiment, which may include a substrate 31 and an optical resonant cavity 30 disposed on the substrate 31, and the like. The optical resonant cavity may include a light reflection structure layer, a light absorption layer 34, a light-trapping structure layer/region 35, and the like, and the light reflection structure layer may include a sidewall reflection wall 32 and a bottom reflection layer 33. The light absorption layer 34 may have a light ray incident outer surface (an upper surface as shown in FIG. 3) and a bottom outer surface (a lower surface as shown in FIG. 3) opposite to each other, and an outer sidewall (a peripheral sidewall as shown in FIG. 3) located between the light ray incident surface and the bottom surface. The light-trapping structure layer/region 35 may cover the light ray incident surface (that is, the upper surface as shown in FIG. 3) of the above light absorption layer 34, so as to be configured to reflect, refract, and scatter a received external light rays 38, and further to disperse the incident external light rays into multiple angles in the light absorption layer 34, thereby increasing optical paths of the external light rays in the light absorption layer 34. Meanwhile, the sidewall reflection wall 32 may cover the outer sidewall of the light absorption layer 34 (that is, the sidewall reflection wall 32 surrounds a periphery of the light absorption layer 34) to form a transverse optical resonant cavity in the extending direction of the light absorption layer 34, so as to perform back and forth reflections on the external light rays which are along the extending direction of the light absorption layer 34 as shown in FIG. 3. The bottom reflection layer 33 may cover the bottom outer surface of the light absorption layer 34 (that is, the bottom reflection layer 33 is located between the light absorption layer 34 and the substrate 31), such that the bottom reflection layer 33 and the above light-trapping structure layer/region 35 form a longitudinal optical resonant cavity in the thickness direction of the light absorption layer 34, so as to perform back and forth reflections on the light rays which are along the thickness direction of the light absorption layer 34 as shown in FIG. 3. That is, the above sidewall reflection wall 32, the bottom reflection layer 33, and the light-trapping structure layer/region 35 surround the light absorption layer 34 to form a sealed optical resonant cavity, and the sealed optical resonant cavity 30 can simultaneously realize the functions of the optical resonant cavity 10 shown in FIG. 1 and the optical resonant cavity 20 shown in FIG. 2, that is, back and forth reflections can be realized for incident light rays at various angles formed by traveling through the light-trapping structure layer/region 35, thereby further increasing the light paths of the external light rays traveling in the light absorption layer 34, and effectively improving the photon absorption efficiency of the photoelectric detector.

Figure 4A:
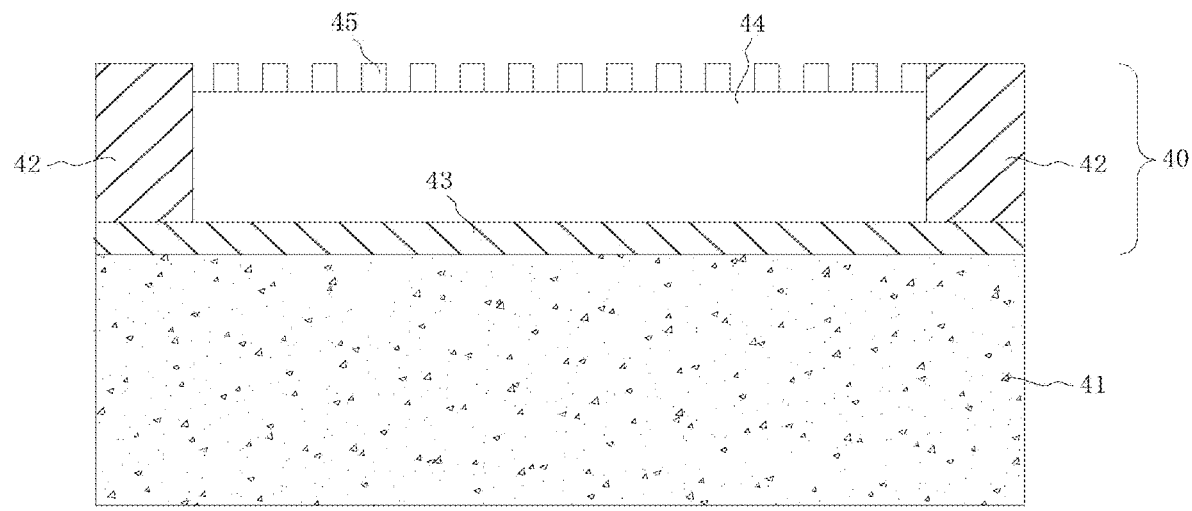
FIG. 4a is a schematic diagram showing a configuration of a photoelectric detector with a sealed optical resonant cavity in another alternative embodiment.
Figure 4B:
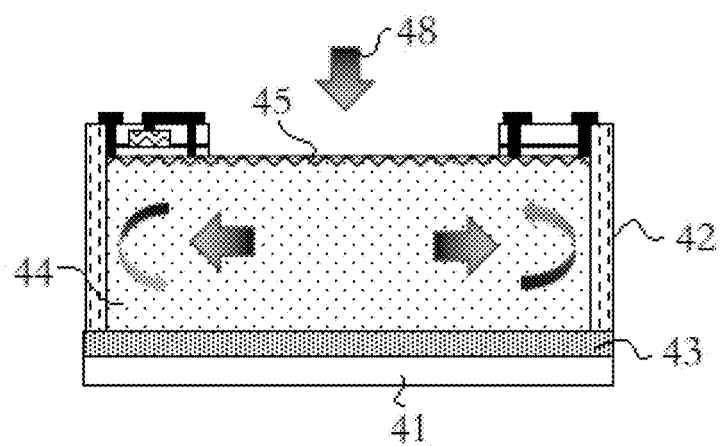
Figure 4C:
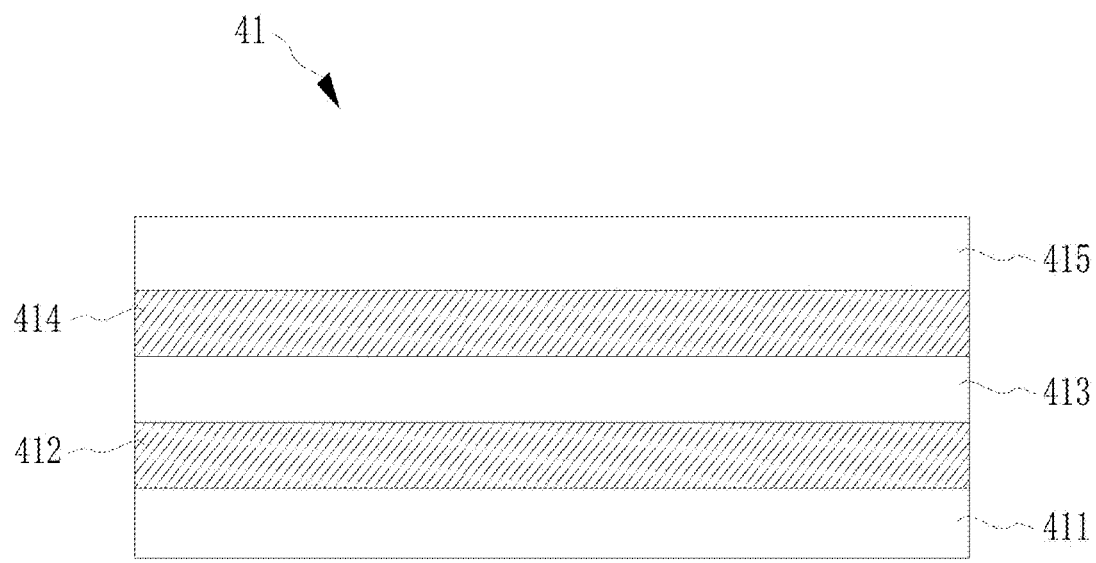

FIG. 4a is a schematic diagram showing a configuration of a photoelectric detector with a sealed optical resonant cavity in another alternative embodiment. FIG. 4b is a schematic diagram showing incident light rays reflected and isolated by a light reflection structure shown in FIG. 4a. FIG. 4c is a schematic diagram showing a configuration of an SOI substrate shown in FIG. 4a. As shown in FIGS. 4a-4b, based on the configuration of the photoelectric detector shown in FIG. 3, another photoelectric detector may be provided in this embodiment, which may include a substrate 41 and an optical resonant cavity 40 disposed on the substrate 41, and the like. The optical resonant cavity may include a light reflection structure layer, a light absorption layer 44, a light-trapping structure layer/region 45, and other components, and the light reflection structure layer may include a sidewall reflection wall 42 and a bottom reflection layer 43. The light absorption layer 44 may have a light ray incident outer surface (an upper surface as shown in FIGS. 4a-4b) and a bottom outer surface (a lower surface as shown in FIGS. 4a-4b) opposite to each other, and an outer sidewall (a peripheral sidewall as shown in FIGS. 4a-4b) located between the light ray incident surface and the bottom surface. The light-trapping structure layer/region 45 may cover the light ray incident surface (that is, the upper surface as shown in FIGS. 4a-4b) of the above light absorption layer 44. The sidewall reflection wall 42 may be formed above the bottom reflection layer 43, and cover the outer sidewall of the light absorption layer 44 (that is, the sidewall reflection wall 42 surrounds a periphery of the light absorption layer 44). The bottom reflection layer 43 may cover the bottom outer surface of the light absorption layer 44 (that is, the bottom reflection layer 43 is located between the light absorption layer 44 and the substrate 41). That is, the above sidewall reflection wall 42, the bottom reflection layer 43, and the light-trapping structure layer/region 45 surround the light absorption layer 44 to form a sealed optical resonant cavity, and the sealed optical resonant cavity 40 can simultaneously realize the functions of the optical resonant cavity 10 shown in FIG. 1 and the optical resonant cavity 20 shown in FIG. 2, that is, back and forth reflections can be realized for external incident light rays 48 formed at various angles after traveling through the above light-trapping structure layer/region 45, thereby further increasing the light paths of the external light rays traveling in the light absorption layer 44, and effectively improving the photon absorption efficiency of the photoelectric detector.

In an alternative embodiment, as shown in FIGS. 2-3 and 4a-4b, the substrates 21, 31 and 41, and the like in the above embodiments may each be a substrate with an optical signal reflection function, such as a metal substrate, a substrate with a distributed Bragg reflection mirror, a substrate with an SOI structure (for example, a double-layer stacked SOI structure) or a substrate with an HCG structure, and the like. The bottom reflection layer 43 may be made of metal or silicon oxide (for example, $SiO_2$), or the like, so as to improve the performance of reflecting light of the optical resonant cavity formed along the thickness direction of the light absorption layer.

It should be noted that in the embodiments of the present disclosure, the SOI structure may each include a silicon substrate, an oxide layer, and a silicon layer stacked in sequence, while the double-layer stacked SOI structure includes a silicon substrate, a first oxide layer, a first silicon layer, a second oxide layer and a second silicon layer stacked in sequence. For example, as shown in FIG. 4c, the substrate 41 is a multi-layer stacked silicon substrate, which may specifically include a silicon substrate 411, a first oxide layer 412, a first silicon layer 413, a second oxide layer 414, and a second silicon layer 415 and the like stacked in sequence.

In an alternative embodiment, as shown in FIGS. 3-4, the above sidewall reflection wall 32 and/or 42 may be a light reflection isolation structure formed by filling a deep trench with Near-infrared (NIR) light absorption materials configured as a first inner wall. The sidewall reflection wall 32 and/or 42 may be made of a material including metal (e.g., Tungsten), insulating material, or the like. Further, the sidewall reflection wall 42 may include a reflection layer and an insulating layer/isolation layer surrounding the reflection layer, which may advantageously increase the light absorption capability (e.g., via rough sidewall surface which may also be referred to as "light absorption surface") of sidewall reflection wall 42, and therefore further eliminating both electrical and optical crosstalk. For example, the insulating layer/isolation layer comprises an oxide film (such as silicon oxide or a combination of different oxide materials) configured as a first outer wall comprising a light absorption surface and/or covering an interior wall of the above deep trench, and the reflection layer may be a light reflection and/or absorption structure that continues to fill the above deep trench. The reflection layer may be made of a material including silicon oxide, amorphous silicon, polysilicon, metal, or other materials having good light reflection properties.

Figure 5:
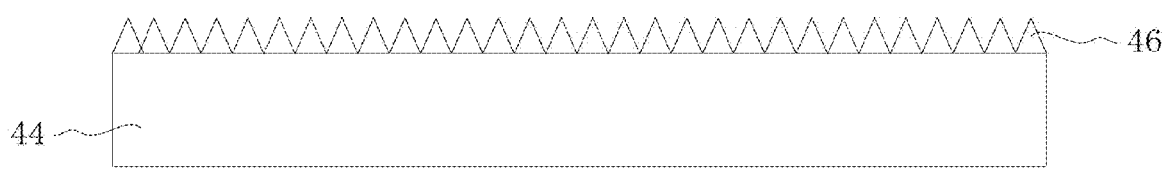
FIG. 5 is a cross-sectional diagram schematically showing a light-trapping structure with zigzag nanostructures in an alternative embodiment.

FIG. 5 is a cross-sectional diagram schematically showing a light-trapping structure with zigzag nanostructures in an alternative embodiment. As shown in FIGS. 4-5, in an alternative embodiment, the light-trapping structure layer/region 46 covering the light ray incident surface (that is, the upper surface as shown in FIGS. 4-5) of the light absorption layer 44 may have concave-convex structures, so as to be configured to change the traveling direction of the incident light rays traveling through the light-trapping structure layer/region 46. In this way, the external light rays entering the light absorption layer 44 have multiple traveling angles, so as to increase the optical paths of the external light rays traveling in the light absorption layer 44, In order to improve the optical performance of the light-trapping structure layer/region 46, the concave-convex structures may be provided in the light-trapping structure layer/region 46 as nano-scale structures, and the concave-convex structures may be distributed in an array, such that a longitudinal section of the concave-convex structures may have a square wave shape as shown in FIGS. 1-4, or the longitudinal section of the concave-convex structures may also have a zigzag shape as shown in FIG. 5, and include a zigzag wave shape with regular triangles and inverted triangles.

Figure 6:
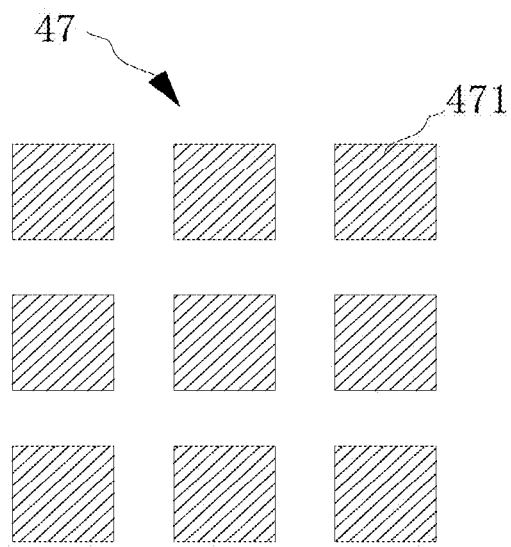
FIG. 6 is a schematic diagram showing nanostructures arranged in a square in an alternative embodiment.
Figure 7:
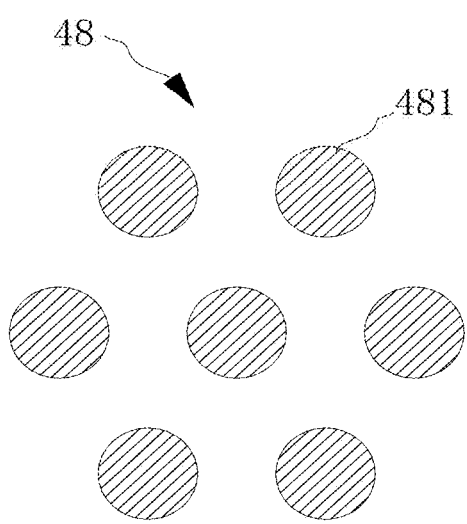
FIG. 7 is a schematic diagram showing nanostructures arranged in a hexagonal close-packed pattern in an alternative embodiment.
Figure 8:
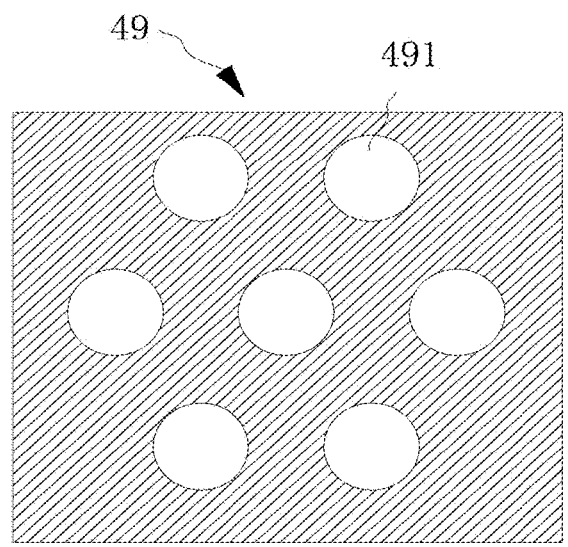
FIG. 8 is a schematic diagram showing nanostructures arranged in a hole-like array pattern in an alternative embodiment.

FIG. 6 is a schematic diagram showing nanostructures arranged in a square in an alternative embodiment, FIG. 7 is a schematic diagram showing nanostructures arranged in a hexagonal close-packed pattern in an alternative embodiment, and FIG. 8 is a schematic diagram showing nanostructures arranged in a hole-like array pattern in an alternative embodiment. As shown in FIGS. 6-8, the nanostructures in the above light-trapping structure may be arranged in a square array 47 as shown in FIG. 6, or may be arranged in a hexagonal close-packed pattern 48 as shown in FIG. 7 or a square close-packed (not shown in the figure) pattern, and meanwhile, they may also be arranged in a hole-like array pattern 49 as shown in FIG. 8. In addition, the arrangement elements in various arrays may be separated by a predetermined spacing less than two microns, and may comprise various configurations such as protrusions, grooves, or boles, or the like, such as square protrusions 471 shown in FIG. 6, circular grooves 481 shown in FIG. 7, and circular holes 491 shown in FIG. 8, and the like. The specific shape and arrangement pattern can be adjusted according to actual conditions, which are not limited in the embodiments of the present disclosure.

Figure 9:
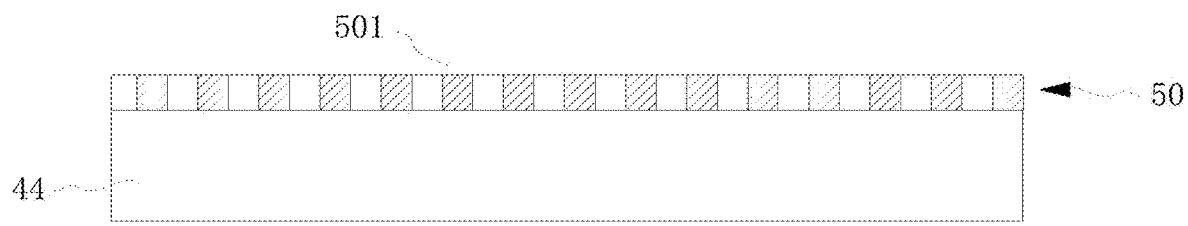
FIG. 9 is a schematic diagram showing square wave-shaped nanostructures formed based on a shallow trench etching process in an alternative embodiment.
Figure 10:
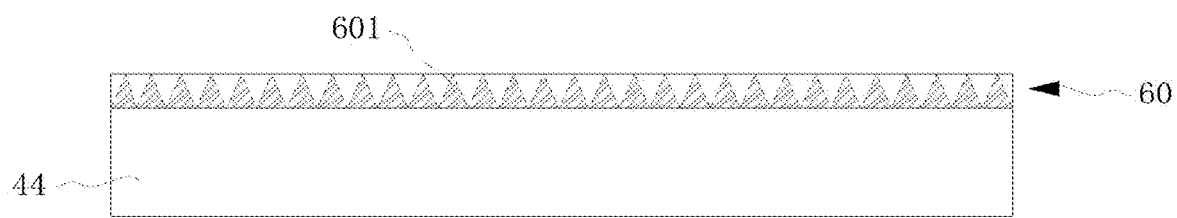
FIG. 10 is a schematic diagram showing zigzag nanostructures formed based on a shallow trench etching process in an alternative embodiment.

FIG. 9 is a schematic diagram showing square wave-shaped nanostructures formed based on a shallow trench etching process in an alternative embodiment. FIG. 10 is a schematic diagram showing zigzag nanostructures formed based on a shallow trench etching process in an alternative embodiment. As shown in FIGS. 9-10, the above light-trapping structure layer/region may be a light-trapping structure layer/region 50 and/or 60 including the concave-convex structures 501 having a square wave shape in cross-section view as shown in FIG. 9 and/or a light-trapping structure layer/region 60 including the concave-convex structures 601 having a square wave shape in cross section view as shown in FIG. 10. The light-trapping structure layer/region 50 and/or 60 may be formed by, etching the light absorption layer 44 by a shallow trench isolation (STI) process to form groove structures and then performing a process such as filling the groove structures with an insulating material or performing passivation or the like.

It should be noted that in the embodiments of the present disclosure, the arrangement pattern of the nanostructures may also be a pattern of random distribution, and the three-dimensional shape of the nanostructure may be a regular shape such as a pyramid or an inverted pyramid (such as a rectangular pyramid), or it may also be an irregular shape. The size of the unit including a concave-convex structure in the nanostructures is generally within a range of tens of nanometers to one micrometer (for example, 20 nm~1 μm, specifically 20 nm, 80 nm, 120 nm, 200 nm, 350 nm, 450 nm, 500 nm, 600 nm. 700 nm, 800 nm, 850 nm, or 1 μm, or the like). That is, adjacent units of the nanostructures may be separated by a predetermined spacing less than two microns, and the size and shape of the nanostructure are not limited in the embodiments of the present disclosure. The nanostructures, with their dimensions associated with desired absorption wavelengths, can perform optical operations such as scattering, refraction, and reflection on the external incident light rays, so that external light rays having a same incident angle enter the light absorption layer with multiple angles.

In an alternative embodiment, the above photoelectric detector may further include a circuit layer/sensing circuit electrically connected to the light absorption layer, the circuit layer is configured to convert a light signal absorbed by the light absorption layer into an electrical signal, and the circuit layer may include components such as a quenching resistor, an electrode, and the like.

In another alternative embodiment, in order to further improve the ability of sensing photon of the photoelectric detector, a microlens may be further disposed on the light-trapping structure to converge external light rays onto the light incident surface of the light-trapping structure.

In another alternative embodiment, the above photoelectric detector may be a photon sensing device such as a single photon detector, an avalanche diode, or a silicon photomultiplier, or the like, meanwhile, the above photoelectric detector may also be a SPAD made of a III-V group or IV group material, such as an InGaAs SPAD or a Si/Ge SPAD.

In an alternative embodiment, the present disclosure further provides a photoelectric detector array. For example, a single photon detector array (SPAD array) or a silicon photomultiplier (SiPM array) may include a plurality of photosensing units distributed in an array wherein adjacent photosensing units are separated by an isolation structure in between (e.g., a deep trench structure). Each of the photosensing units may include the photoelectric detector as described in any one of the embodiments of the present disclosure. A sidewall reflection wall is formed by, for example, filling deep trenches between adjacent photosensing units with NIR light absorption materials configured as the first inner wall, to form an optical resonant cavity in the extending direction of the light absorption layer, so as to improve the photon capture efficiency of the photoelectric detector array. By using the sidewall reflection wall, operations such as isolation can also be performed on adjacent photosensing units, thereby further effectively eliminating the defect of optical crosstalk between adjacent optical sensing units at the same time.

In an alternative embodiment, the present application further provides a photonic chip. which may include the photoelectric detector or the photoelectric detector array described in any one of the above embodiments. The photonic chip may be a ranging chip, a depth imaging chip, and a time of flight (TOF) chip, and the like.

In an alternative embodiment, the present disclosure further provides a photoelectric detection terminal, which may include a device body and the above photoelectric detector array (or the photonic chip, or the like) that are connected to each other. The device body can perform photoelectric sensing of photons through the photoelectric detector array described in any one of the embodiments of the present disclosure. The above photoelectric detection terminal may include a photoelectric sensitive ranging device (such as a lidar), a mobile communication device (such as a mobile phone), and an image processing device (such as a camera).

Combining actual applications, and taking the photoelectric detector being a single photon detector (SPAD) or a silicon photoelectric multiplier (SiPM) and being applied to a lidar as an example, the photoelectric detector, the photoelectric detector array, and the photoelectric detector terminal are described in detail, but it should be noted that, in actual applications, the SiPM and the SPAD array in the embodiments of the present disclosure are applied to photonic chips such as a ToF (time of flight) chip and/or a depth imaging chip on a mobile phone. Details are as follows.

The photoelectric detector (such as photon detector, etc.) can be widely used in technical fields such as deep detection (such as lidar), medical imaging, quantum communication, and the like, and in the specific using process, it can be applied as one single-photon detector (SPAD), silicon photomultiplier (SiPM), SPAD array, or other forms.

Figure 11A:
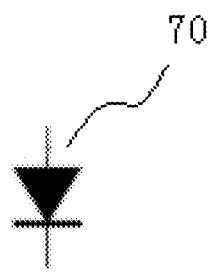
FIG. 11a is an equivalent circuit component of a single-photon detector.
Figure 11B:
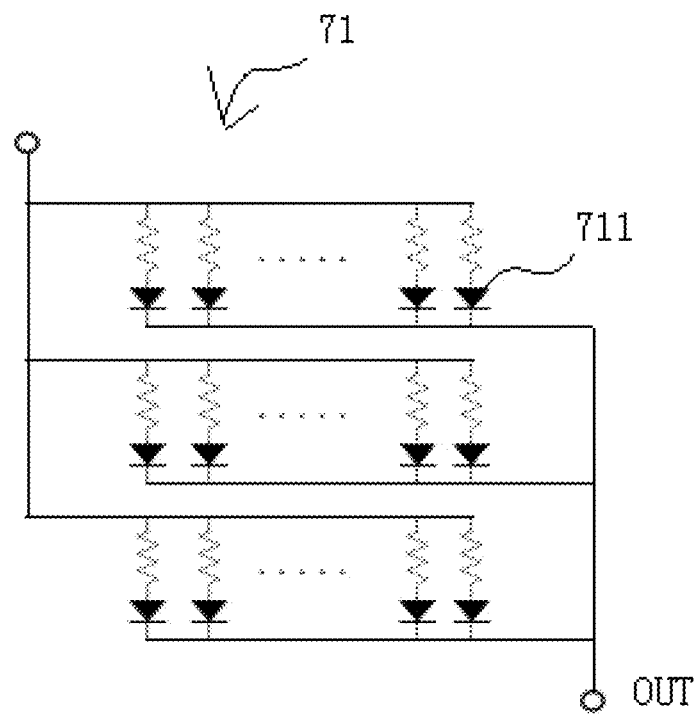
FIG. 11b is an equivalent circuit diagram showing a silicon photomultiplier.
Figures 11C, 11D:
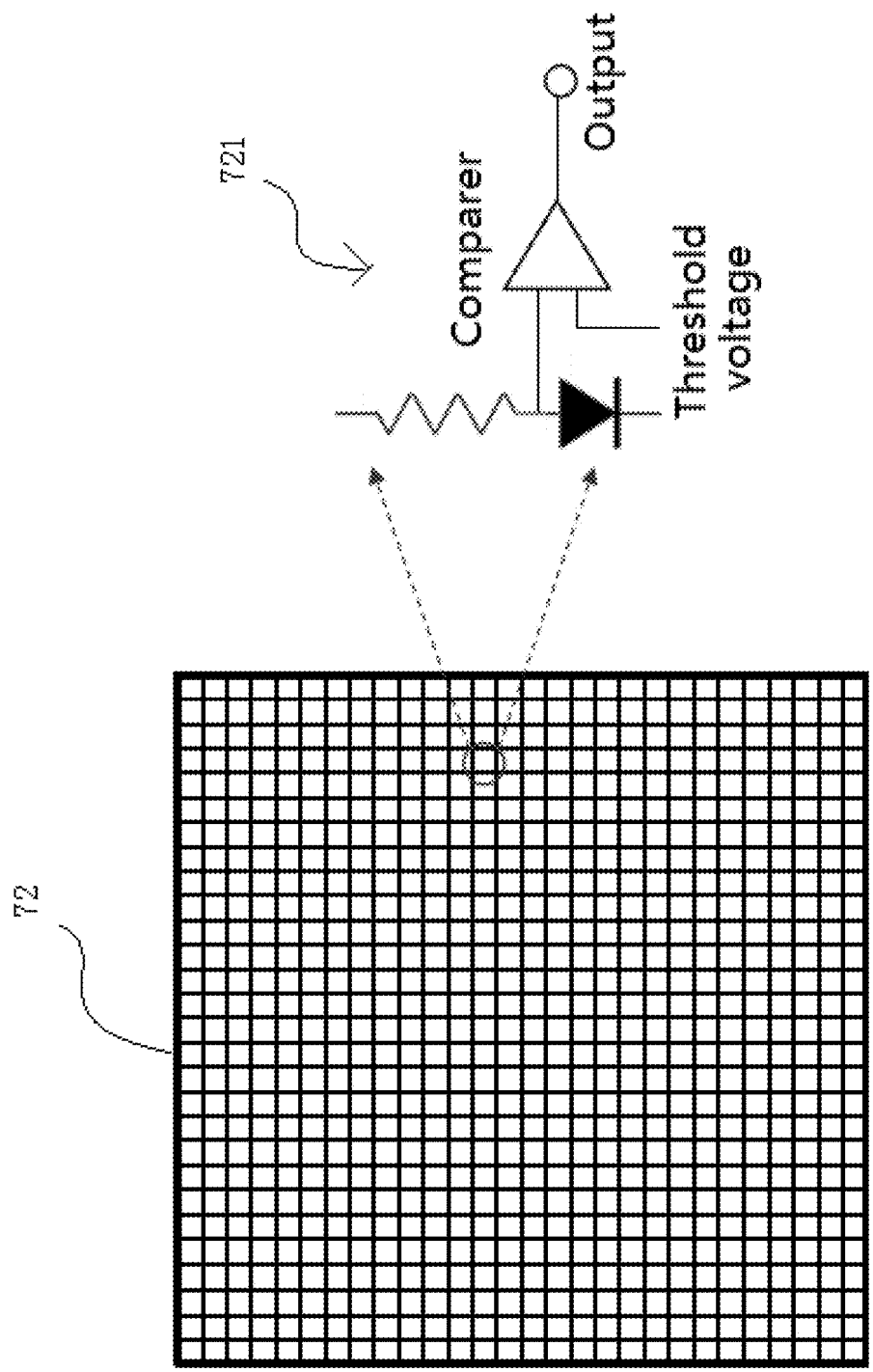
FIG. 11c is a top view of a single-photon detector array plate.
FIG. 11d is an equivalent circuit diagram showing a photoelectric sensing unit in the single-photon detector array plate in FIG. 11c.

FIG. 11a is an equivalent circuit component of a single-photon detector. FIG. 11b is an equivalent circuit diagram showing a silicon photomultiplier. FIG. 11e is a top view of a single-photon detector array plate. FIG. 11d is an equivalent circuit diagram showing a photoelectric sensing unit in the single-photon detector array plate in FIG. 11c. As shown in FIG. 11a, since one single-photon detector is equivalent to one photoelectric diode 70, that is, a single photon detector is a binary component, which only has two states of "there being an output signal" and "there being no output signal". In order to measure an intensity signal of the received photons, it can be applied in the form of a silicon photomultiplier or a single photon detector array in deep detection fields such as lidar.

As shown in FIG. 11b, in the equivalent circuit 71 of the silicon photomultiplier, since the output terminals OUT of the single-photon detector 711 are connected together in parallel to output signals as a whole, and the SPAD subunits shown in FIG. 11b are used, identifying the intensity of the light signal can be realized.

As shown in FIGS. 11e-11d, since each sensing unit 721 in the single-photon detector array (SPAD array) 72 outputs individually, it can be applied to a device such as a lidar (flash LIDAR) to directly generate images.

However, since the conventional single-photon detector, silicon photomultiplier, and SPAD array are based on a silicon-based planar structure, the external photons entering the device layer are incident perpendicularly or approximately perpendicularly, that is, the photon absorption efficiency of a photoelectric detector is positively related to a thickness of a device layer (that is, the light absorption layer). For example, when the lidar uses the near-infrared band wherein the wavelength is between 900 nm and 950 nm (such as a 905 nm wavelength), due to that the device layer is relatively thin, the silicon-based SPAD has a relatively low light absorption efficiency, and it may even cause a "blind area" appearing in the lidar so that it cannot capture distant light signals in time.

Figure 12:
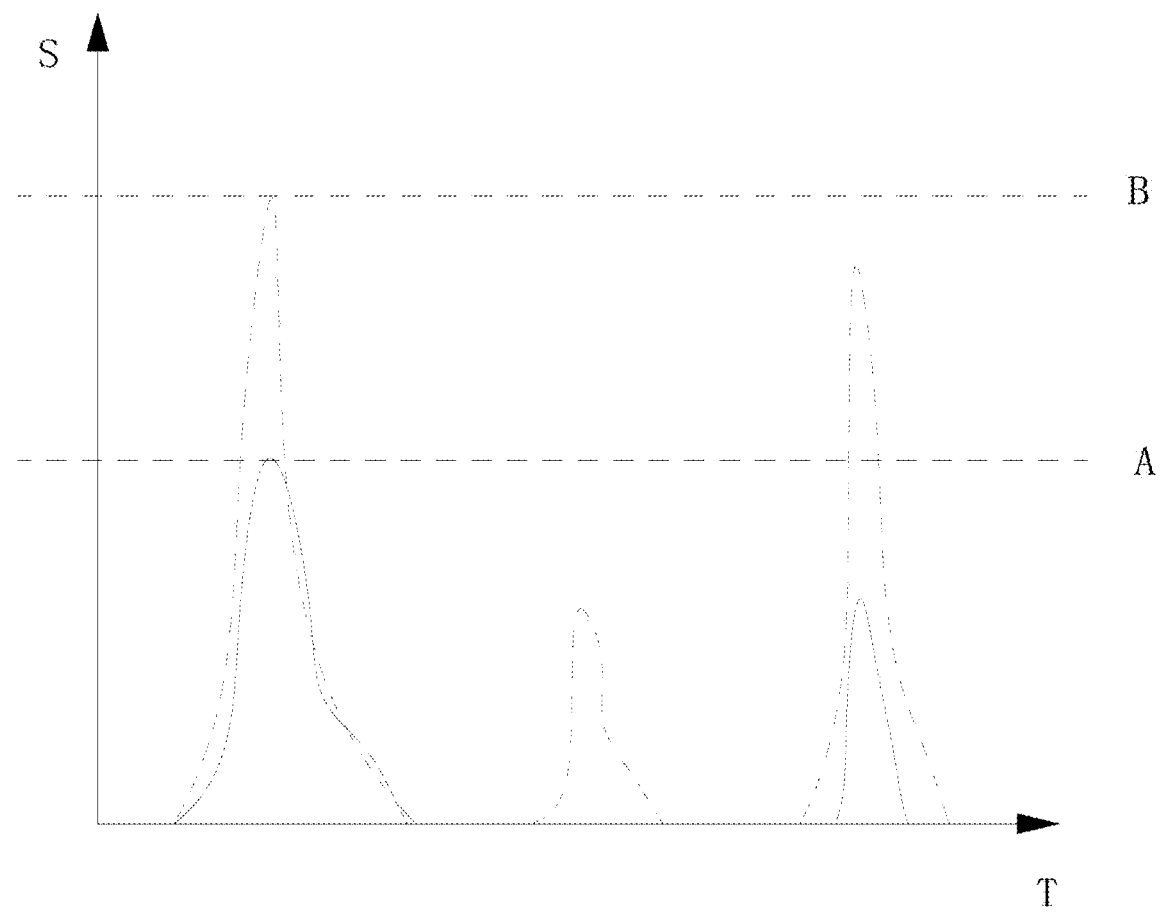
FIG. 12 is a schematic diagram showing crosstalk boosting a noise floor of a device.

FIG. 12 is a schematic diagram showing crosstalk boosting a noise floor of a device. As shown in FIG. 12, the abscissa is used to characterize time T, the ordinate is used to characterize modeling constant response S, the dashed line A is used to characterize a noise threshold of a device when there is no crosstalk, and the dashed line B is used to characterize a noise threshold of a device when there is crosstalk. Since there is a dark count rate (DCR) during the use of a SPAD device, it will not only cause relative large crosstalk between the photosensing units in the SPAD array, but also greatly increase the noise base of the device as shown in FIG. 12. For example, when one photosensing unit (such as a SPAD unit) causes a non-signal light trigger due to thermal effects or other reasons, an adjacent photosensing unit will also cause the non-signal light trigger, thereby further causing the noise threshold of the device when there is no crosstalk to be much lower than the noise threshold of the device when there is crosstalk. That is, for the SiPM or SPAD array as an optical signal capture device, when there is crosstalk, the crosstalk noise will be increased in the lidar system, and then the signal-to-noise ratio of the device will be seriously affected.

In conventional technologies, the light absorption efficiency of the SPAD device is generally increased by increasing the thickness of the device layer, but an excessively thick device layer will not only increase both the difficulty of the manufacturing process and the manufacturing cost, but also cannot achieve compatibility with the conventional COMS process. Meanwhile, a relatively thick device layer will also significantly increase a jitter time of the device, which will further greatly reduce the accuracy of distance detection and the like.

In addition, surfaces of the device layers of the planar-structured single-photon detector, silicon photomultiplier, and SPAD array need to be manufactured with an anti-reflection layer. The anti-reflection effect of the anti-reflection layer will decrease as the incident angle increases, which, in turn, will lead to that the light absorption efficiency of the detector decreases as the incident angle of the light ray increases.

Figure 13:
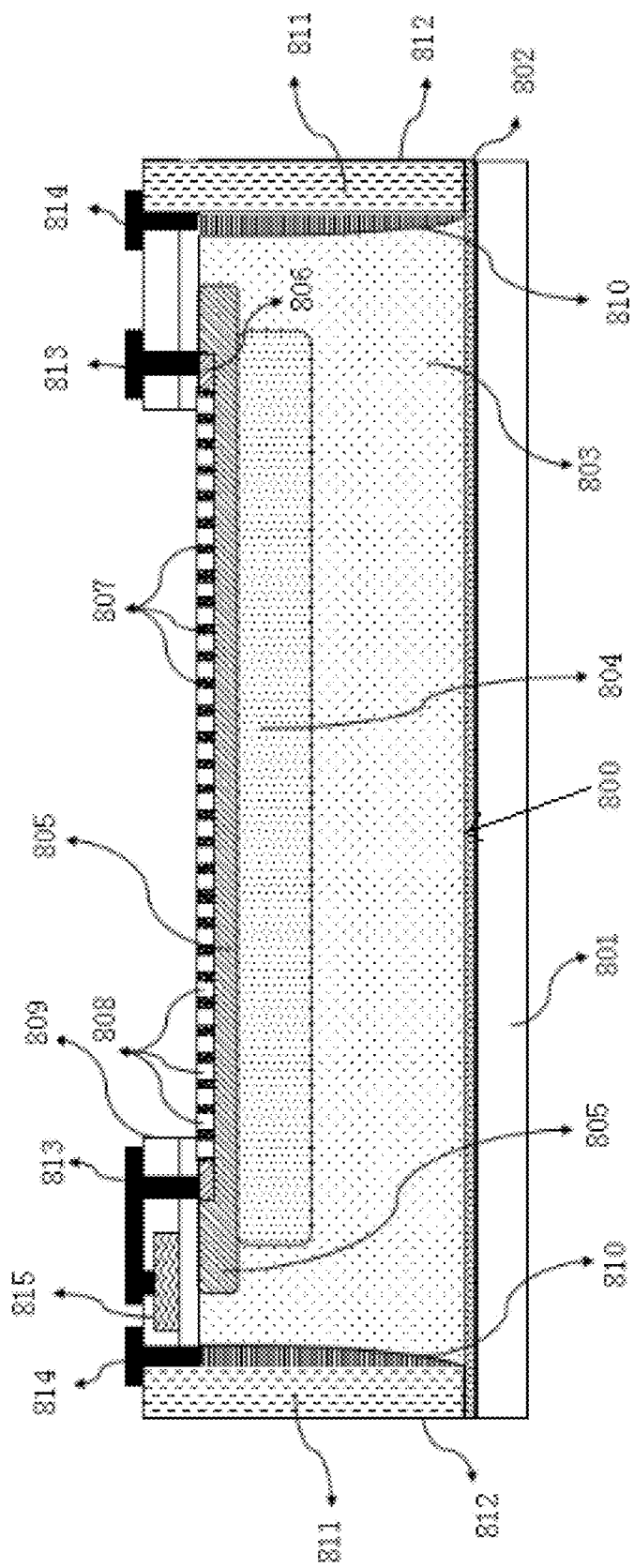
FIG. 13 is a schematic diagram showing a device configuration of a photoelectric detector in an alternative embodiment.

FIG. 13 is a schematic diagram showing a device configuration of a photoelectric detector in an alternative embodiment. As shown in FIG. 13, in an alternative embodiment, the present disclosure further provides a photoelectric detector, which may include a substrate 801, a bottom reflection layer 802, a light absorption layer 800 (may also be referred to as "absorption material"), a sidewall reflection wall 811, and a light-trapping structure layer/region (not marked in the figure). The light-trapping structure layer/region includes nanostructures 807 and protective filling structures 808. The bottom reflection layer 802 may cover the upper surface of the substrate 801, and the light absorption layer 800 may be formed on the upper surface of the bottom reflection layer 802. The sidewall reflection wall 811 may extend through the light absorption layer 800 and to the surface of the bottom reflection layer 802 or into the bottom reflection layer 802 along the thickness direction. The light-trapping structure layer/region may be disposed on the upper surface of the light absorption layer to perform optical operations such as scattering, refraction, and reflection on the external incident light rays, so that the external light rays having a same incident angle enter the light absorption layer 800 with multiple angles.

Further, as shown in FIG. 13, a first doped region 803, a second doped region 804, a third doped region 810, a fourth doped region 805, and a fifth doped region 806 are configured as a concentration gradient formed in the above light absorption layer 800. Second doped region 804 and fourth doped region 805 together constitute a p-n junction region which may be referred to as an active region/SPAD region. The doping ions in the first doped region 803, the second doped region 804, and the third doped region 810 are first-type ions, while the doping ions in the fourth doped region 805 and the fifth doped region 806 are second-type ions, that is, the first-type ions and the second-type ions are two types of ions having different types. Meanwhile, an ion concentration of the third doped region 810, which may be formed by an implantation (e.g., to form an implant region) and/or other processes and characterized by a gradually tapered (toward the substrate below) shape and a reduced impedance, is greater than that in the second doped region 804, an ion concentration of the fifth doped region 806 is greater than that in the fourth doped region 805, and an ion concentration of the first doped region 803 is gradually reduced along the direction away from the bottom reflection layer 802.

Further, as shown in FIG. 13, the second doped region 804, the third doped region 810, the fourth doped region 805, and the fifth doped region 806 are all formed in the first doped region 803, and the third doped region 810 is formed at an interface between the sidewall reflection wall 812 and the light absorption layer 800. A gap is formed both between the third doped region 810 and the second doped region 804 and left between the third doped region 810 and the fourth doped region 805. The fourth doped region 805 is formed at a position of the upper surface of the light absorption layer 03, and the light-trapping structure layer/region is disposed at an upper surface of the fourth doped region 805. The fifth doped region 806 is adjacent to one end of the light-trapping structure and is formed at a position of the upper surface of the light absorption layer 800 in the fourth doped region 805, so as to be configured to electrically connect the fourth doped region to another device. For example, the fourth doped region may be electrically connected to a quenching resistor through an electrode. The above light-trapping structure layer/region forms the above nanostructures 807 and protective filling structures 808 by etching the upper surface of the light absorption layer 800 by a shallow trench process. The sidewall reflective wall 812 surrounds the light absorption layer 800 along the sidewall 811 of the photoelectric detector.

In an alternative embodiment, as shown in FIG. 13, the above photoelectric detector may further include an insulating composite layer 809, a quenching resistor layer 815, a first electrode 814, and a second electrode 813. The insulating composite layer 809 may be adjacent to the sidewall reflection wall 811 and be disposed at the upper surface of the light absorption layer 800, and thus partially overlaying the light-trapping region. The quenching resistor layer 815 may be formed in the insulating composite layer 809. The first electrode 814 and the second electrode 813 may be formed above the insulating composite layer 809. The first electrode 814 is electrically connected to the third doped region 810, which may have a reduced electrical impedance. The second electrode 813 is electrically connected to the quenching resistor 816 and the fifth doped region 806, respectively. In addition, since the third doped region 810 is adjacent to the sidewall of the deep trench (that is, disposed to be adjacent to the sidewall reflection wall 812) and is doped with high-concentration ions, and meanwhile, the above first electrode 814 is further connected to the third doped region 810, the parasitic resistance of a photoelectric detector such as a SPAD can be effectively reduced, the avalanche current can be increased and the electrical signal can be enhanced.

In an alternative embodiment, as shown in FIG. 13, a sixth doped region (not marked in the figure) is formed at a position of the upper surface of the nanostructures 807, and the doping ions in the sixth doped region are the first-type ions. An ion concentration of the sixth doped region is greater than an ion concentration of the second doped region 804, and an ion concentration of the third doped region 810 is greater than or equal to an ion concentration of the sixth doped region. The fifth doped region 806 and the sixth doped region can each be a heavily doped region. The heavily doped regions with different types of ions may have the same or different ion doping concentrations, which can be set according to the actual process and the requirements for device performance. In an alternative embodiment, as shown in FIG. 13, the above first-type ions may be P-type ions, and the second-type ions may correspond to N-type ions. Correspondingly, if the first-type ions are N-type ions, then the second-type ions correspond to P-type ions.

In an alternative embodiment, based on the configuration shown in FIG. 13, an eighth doped region (not shown in the figure) with a doping type of the second-type ions may be further added to the light absorption layer 800 under the second electrode 813. The eighth doped region may be in contact with the second doped region 804 and the fourth doped region 805 respectively, and be located under the quenching resistor 815, to form a guard ring surrounding the second doped region 804 and the fourth doped region 805, so as to effectively reduce the noise of the device and improve the photosensing performance of the product.

Figure 14:
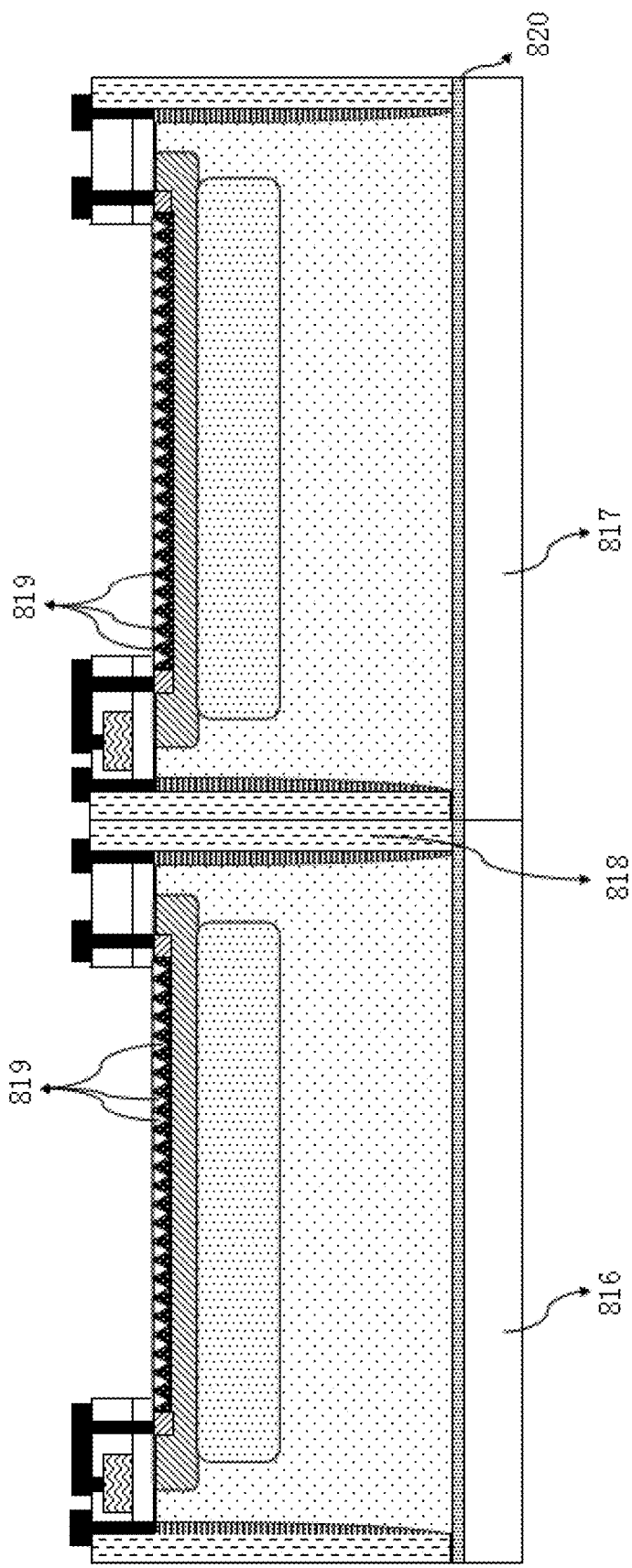
FIG. 14 is a schematic diagram showing a device configuration of a photoelectric detector array in an alternative embodiment.

FIG. 14 is a schematic diagram showing a device configuration of a photoelectric detector array in an alternative embodiment. As shown in FIG. 14, based on the configuration shown in FIG. 13, a photoelectric detector array may include at least two adjacent photosensing units, such as the first photosensing unit 816 and the second photosensing unit 817 shown in FIG. 14. Each of the photosensing units may adopt the same or similar configuration as shown in FIG. 13, that is, through the optical resonant cavity formed of the bottom reflection layer 820 and the light-trapping structure layer/region 819 arranged at the bottom, the optical paths of the incident light rays in the light absorption layer can be increased in the longitudinal direction. In the same way, an isolation reflection structure 818 (e.g., a deep trench structure) is formed between the two adjacent photosensing unit 816 and photosensing unit 817, and the isolation reflection structure 818 can be the isolation reflection structure 818 as shown in FIG. 14 formed by performing a deep trench etching process and then filling with a light absorption material as the first inner wall, such as insulating material or metal or NIR light absorption material (e.g., Tungsten) and the like. Since the isolation reflection structure 818 (e.g., the first outer wall comprising a first light absorption surface) is arranged so as to surround the sidewall of the light absorption layer, the isolation reflection structure 818 can independently form an optical resonant cavity in the extending direction of the light absorption layer, thereby realizing the back and forth reflections on the incident light rays of which the traveling directions are changed via the light-trapping structure 819, so as to increase the optical paths of the incident light rays traveling in the light absorption layer and/or absorb the incident light rays within the optical resonant cavity, and to further play a role of optically isolating the crosstalk between adjacent photosensing units in the meantime, thereby effectively improving the light absorption efficiency and ability to resist crosstalk of the photoelectric detector array.

Figure 15:
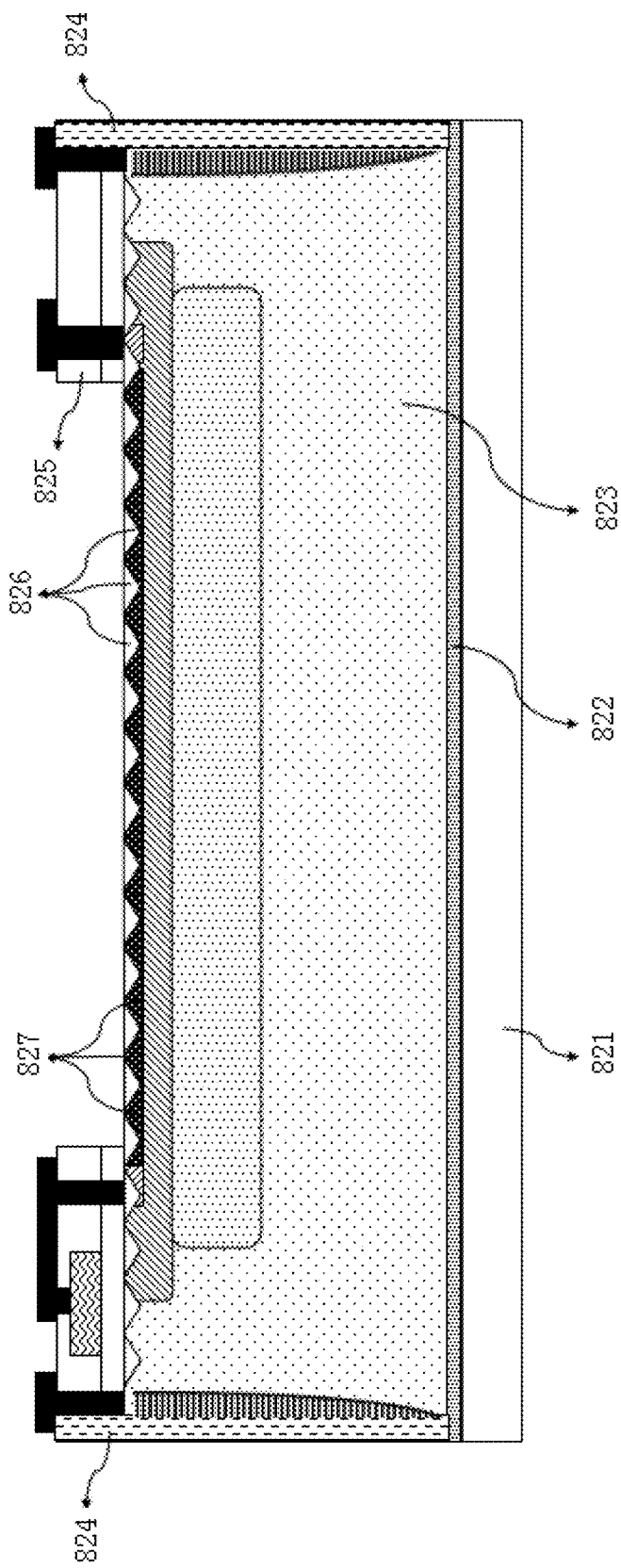
FIG. 15 is a schematic diagram showing a device configuration of a photoelectric detector in another alternative embodiment.

FIG. 15 is a schematic diagram showing a device configuration of a photoelectric detector in another alternative embodiment. As shown in FIG. 15, improvement may be made on the basis of the configuration shown in FIG. 13, that is, the photoelectric detector may include a substrate 821, a bottom reflection layer 822, and a light absorption layer/absorption material 823 stacked in sequence, and a fully covered light-trapping structure layer/region may be formed on the top surface of the light absorption layer 823. The light-trapping structure layer/region may include nanostructures 827 and protective filling structures 826. Meanwhile, a sidewall reflection isolation structure 824 covers and surrounds the sidewall of the light absorption layer 823, such that the three of the sidewall reflection isolation structure 824, the light-trapping structure layer/region, and the bottom reflection layer 822 form a fully closed optical resonant cavity, so as to further improve the light absorption efficiency of the device.

Figure 16:
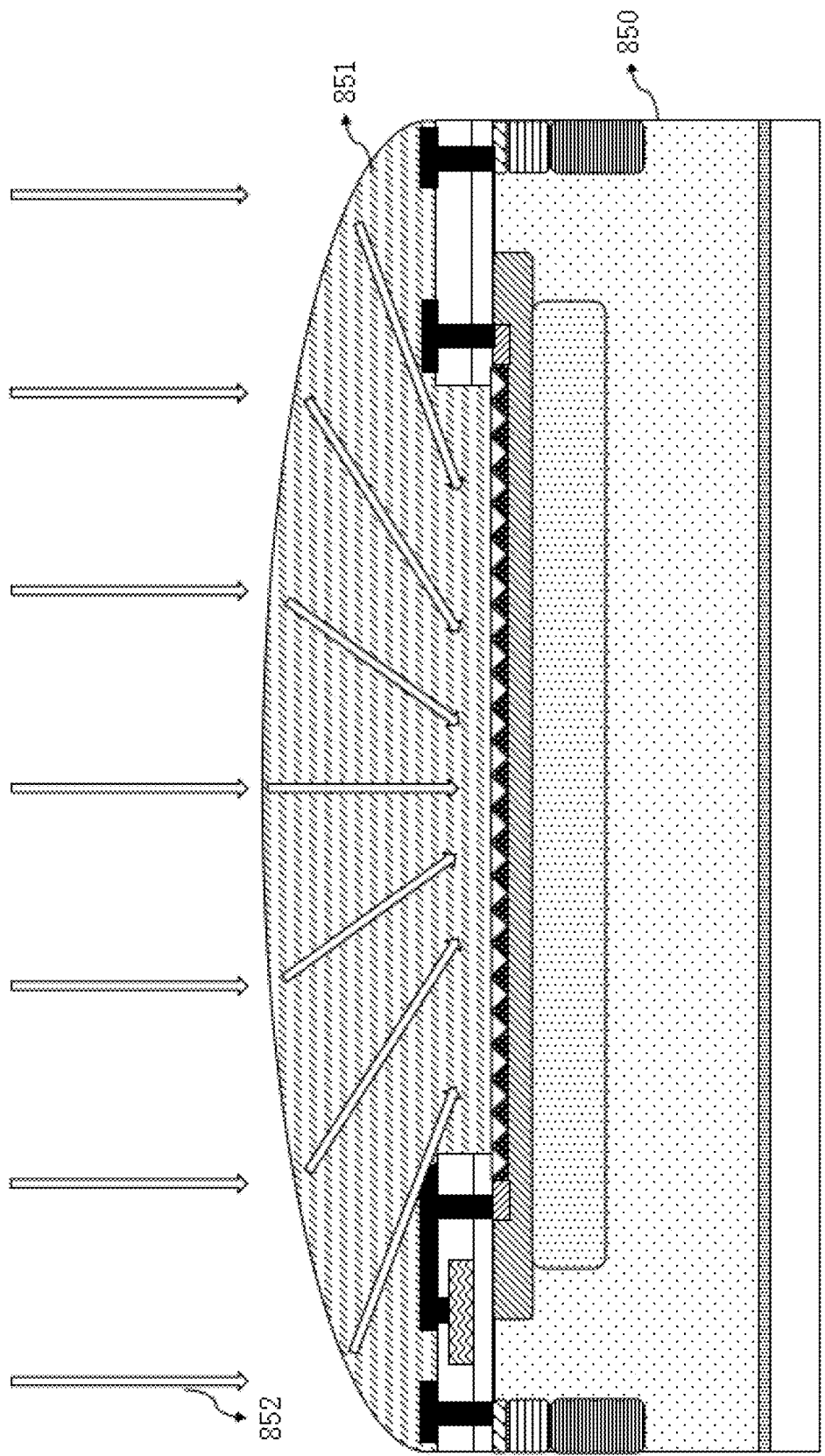
FIG. 16 is a schematic diagram showing a device configuration of a photoelectric detector provided with a microlens in an alternative embodiment.

FIG. 16 is a schematic diagram showing a device configuration of a photoelectric detector disposed with a microlens in an alternative embodiment. As shown in FIG. 16, based on the configuration shown in FIG. 13, a microlens 851 may be disposed through the light incident surface of the photoelectric detector 850, and then the external light rays 852 entering the microlens 851 are converged to the light-trapping structure in the photoelectric detector 850, thereby improving the photoelectric sensitive performance of the photoelectric detector. Meanwhile, the external light rays can also be converged to the light-sensitive region of the photoelectric sensor, so as to further improve the light absorption efficiency of the device.

Figure 17:
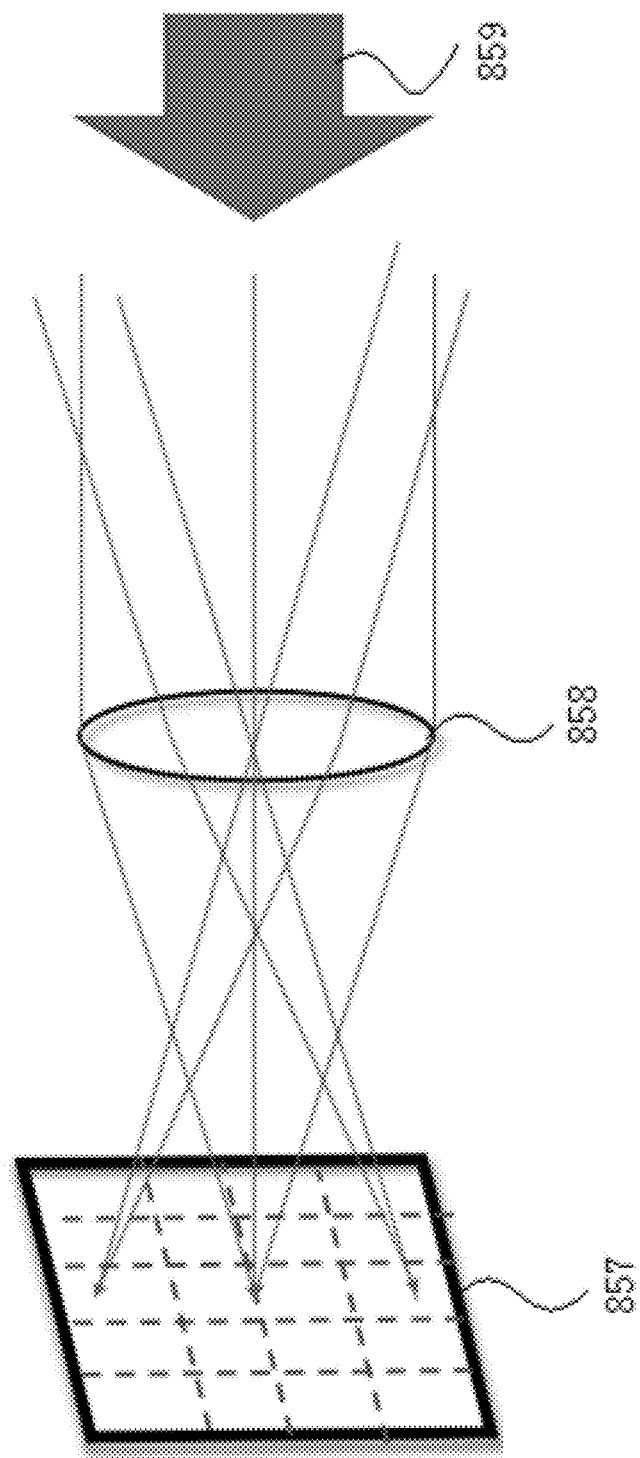
FIG. 17 is a schematic diagram showing a configuration of a receiving end of a lidar in an alternative embodiment.

FIG. 17 is a schematic diagram showing a configuration of a receiving end of a lidar in an alternative embodiment. As shown in FIG. 17, a lidar receiving end may include the photoelectric detector and photoelectric detector array (such as SiPM or SPAD array, or the like) described in any one of the embodiments of the present disclosure. The SPAD array is taken as an example for the description below. The lidar receiving end includes a SPAD array 857 and a lens 858, and the configuration of any SPAD in the SPAD array may be the configuration of the photoelectric detector in the embodiments of the present disclosure, and when the external light rays 859 travel through the transparent lens 858 and enter the SPAD array 857, components such as the light-trapping structure, the bottom reflection layer, and the sidewall isolation wall can be used to effectively increase the optical paths of the external light rays 857 in the light absorption layer, thereby effectively improving the photon capture efficiency of the lidar.

Using the technical solutions in the embodiments of the present application, for the SiPM or SPAD array-based lidar, it not only can effectively improve the signal-to-noise ratio of the device, increase the detection range of the lidar, and improve the detection quality, but also can effectively reduce the cost of the lidar receiving end, and improve the product yield. In addition, it can further ensure that the lidar where the sub-light ray sensing unit is located to have a root response performance, and reduce the impact of light source wavelength drift on the performance of the lidar.

In an alternative embodiment, the present disclosure further provides a method for manufacturing a photoelectric detector, which may specifically include the following steps.

Step S1, an SOI substrate is provided.

Step S2, a silicon epitaxial layer is formed on two opposite sides of the above SOI substrate by using an epitaxial silicon growth process.

Step S3, P-type ion doping is performed on the silicon epitaxial layer to form a gradually doped region having a concentration gradient where an ion concentration gradually reduces along a direction away from the substrate. The doping process may also be performed while performing epitaxial growth of the silicon epitaxial layer in step S2. That is, the growth is accompanied by doping, so as to form the above gradually doped region in the silicon epitaxial layer while forming the silicon epitaxial layer.

Step S4, the gradually doped region is etched to form a deep trench (DTI) extending to the substrate. An oxide film is deposited or grown on an inner wall of the deep trench, and then the deep trench is fully filled with metal (e.g., Tungsten), polysilicon or insulating material (such as silicon dioxide), or the like to form a sidewall isolation wall that reflects and/or absorb light and blocks photoelectricity in the deep trench. The etching and deposition (or grow) processes that form the DTI may produce highly absorptive (e.g., with a light-absorption texture) DIT sidewall surfaces that help light absorption and prevent undesirable interference and crosstalk Step S5, doped regions are formed in the silicon epitaxial layer by a process such as plasma implantation or the like.

Step S6, a process such as STI etching is performed on a surface of the silicon epitaxial layer to form a surface nano-optical structure, and surface passivation (e.g., to form a passivation layer) or ion doping is performed to form a light-trapping structure with a protective layer.

Step S7, a quenching resistor, and electrode structures are manufactured, and then surface passivation and/or electrical insulation treatment are performed to form a device such as a photoelectric sensor or a photoelectric sensor array.

The method for manufacturing the photoelectric detector in the above embodiment is not only compatible with the COMS process, but also can greatly improve the light absorption efficiency of the manufactured single photoelectric sensor (such as a SPAD), and effectively solve the problem of crosstalk between adjacent photoelectric sensors. Meanwhile, it further maintains the photon capture with a wide spectrum and wide incident angle performed on the external light rays, and it further ensures the accuracy of measurement of the depth measurement device such as lidar under the premise that the jitter time remains unchanged.

It should be noted that in any one of the embodiments of the present disclosure, all the films made of silicon (Si) may be partially or completely replaced with germanium (Ge) or III-V materials, which may be selected according to the requirements for the photoelectric performance of the photoelectric detector and the required type of light rays to be detected. For example, when the photoelectric detector needs to detect infrared light rays, each of the above silicon film layers may be replaced with a germanium film or a silicon germanium film to improve the detection accuracy and sensitivity of the photoelectric detector for infrared light.

The technical features of the above-described embodiments can be combined arbitrarily. To simplify the description, not all possible combinations of the technical features in the above embodiments are described. However, all of the combinations of these technical features should be considered as within the scope of this disclosure, as long as such combinations do not contradict each other.

The above-described embodiments are merely illustrate several embodiments of the present disclosure, which are described more specifically and in detail, but they cannot be understood as limiting the scope of the present disclosure. It should be noted that, for those ordinary skilled in the art, several variations and improvements may be made without departing from the concept of the present disclosure, and all of which are within the protection scope of the present disclosure. Therefore, the protection scope of the present disclosure shall be subject to the appended claims.

What is claimed is:

1. A photodetector device comprising:
    an absorption material having a top side and a bottom side;
    a first deep trench structure configured adjacent to a first lateral side of the absorption material, the first deep trench structure comprising a first inner wall and a first outer wall, the first outer wall comprising a first light absorption surface of incoming photons;
    a second deep trench structure configured adjacent to a second lateral side of the absorption material;
    an active region on the top side of the absorption material;
    a light-trapping region overlaying the active region comprising a first structure and a second structure separated by a predetermined spacing, the predetermined spacing being less than two microns and associated with a target wavelength and an absorption angle of incoming photons;
    a substrate configured near the bottom side; and
    a bottom reflection layer positioned between the substrate and the absorption material.

2. The device of claim 1, wherein the first inner wall comprises a metal material and the first outer wall comprises an oxide material or a combination of different oxide materials.

3. The device of claim 1, wherein the first structure and the second structure are characterized by a substantially rectangular or triangular shape.

4. The device of claim 1, wherein the target wavelength is associated with a wavelength between 900 nm and 950 nm.

5. The device of claim 1, wherein the substrate comprises an SOI structure.

6. The device of claim 1, wherein the first deep trench structure comprises a reflection layer and an isolation layer.

7. The device of claim 1, further comprising a passivation layer overlaying the active region.

8. The device of claim 1, wherein the first inner wall comprises a Tungsten material.

9. The device of claim 1, wherein the first light absorption surface is characterized by a surface roughness associated with etching, deposition or growth process.

10. The device of claim 1, further comprising a microlens overlaying the light-trapping region.

11. The device of claim 1, wherein the absorption material is characterized by a concentration gradient.

12. The device of claim 1, wherein the active region further comprises a p-n junction region configured within the absorption material.

* * * * *